(12) United States Patent
Funahashi et al.

(10) Patent No.: US 10,459,871 B2
(45) Date of Patent: Oct. 29, 2019

(54) SWITCHING REDUCTION BUS USING DATA BIT INVERSION WITH SHIELD LINES

(71) Applicant: Micron Technology, Inc., Boise, ID (US)

(72) Inventors: Akinori Funahashi, Tachikawa (JP); Chikara Kondo, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 142 days.

(21) Appl. No.: 15/703,736

(22) Filed: Sep. 13, 2017

(65) Prior Publication Data

US 2019/0079893 A1    Mar. 14, 2019

(51) Int. Cl.
| | |
|---|---|
| *G06F 13/12* | (2006.01) |
| *G06F 13/42* | (2006.01) |
| *G11C 8/18* | (2006.01) |
| *G11C 5/06* | (2006.01) |
| *G06F 13/16* | (2006.01) |
| *G11C 7/02* | (2006.01) |
| *G11C 7/10* | (2006.01) |

(52) U.S. Cl.
CPC ...... *G06F 13/4243* (2013.01); *G06F 13/1689* (2013.01); *G11C 5/066* (2013.01); *G11C 8/18* (2013.01); *G11C 5/06* (2013.01); *G11C 7/02* (2013.01); *G11C 7/1048* (2013.01)

(58) Field of Classification Search
CPC . G06F 13/4243; G06F 13/1689; G11C 5/066; G11C 8/18
See application file for complete search history.

(56) References Cited

U.S. PATENT DOCUMENTS

| | | | | |
|---|---|---|---|---|
| 2002/0191476 A1* | 12/2002 | Kojima | ............... | G11C 7/1078 365/230.06 |
| 2004/0217479 A1* | 11/2004 | Katsura | ............... | H01L 23/5225 257/758 |
| 2006/0280022 A1* | 12/2006 | Kono | ............... | G11C 16/0433 365/230.03 |
| 2009/0059640 A1* | 3/2009 | Funane | ............... | G11C 8/16 365/51 |
| 2013/0061006 A1* | 3/2013 | Hein | ............... | G06F 13/4243 711/154 |
| 2014/0332930 A1* | 11/2014 | Kamiya | ............... | H01L 23/481 257/621 |
| 2015/0205176 A1* | 7/2015 | Lu | ............... | G02F 1/136209 349/44 |
| 2016/0154032 A1* | 6/2016 | Kuramochi | ............... | G05F 1/561 324/120 |

* cited by examiner

*Primary Examiner* — Jing-Yih Shyu
(74) *Attorney, Agent, or Firm* — Schwegman Lundberg & Woessner, P.A.

(57) ABSTRACT

Apparatus and methods structured with respect to a data bus having a number of data lines and a number of shield lines can be implemented in a variety of applications. Such apparatus and methods can include driver and receiver circuits that operate to generate and/or decode a data bit inversion signal associated with data propagated on data lines of the data bus. The driver and receiver circuits may be arranged to operate on a two bit basis to interface with the data bus having data lines grouped with respect to the two bits with shield lines for the respective two bit data lines.

22 Claims, 19 Drawing Sheets

OUTPUT DATA TABLE ({Do[1:0], DBIo})

| Dp[1:0] | DBIp | D[1:0] | | | |
|---|---|---|---|---|---|
| | | 00 | 01 | 10 | 11 |
| 00 | 0 | 00,0 | 01,0 | 10,0 | 00,1 |
| 00 | 1 | 00,0 | 10,1 | 01,1 | 00,1 |
| 01 | 0 | 00,0 | 01,0 | 01,1 | 11,0 |
| 01 | 1 | 11,1 | 01,0 | 01,1 | 00,1 |
| 10 | 0 | 00,0 | 10,1 | 10,0 | 11,0 |
| 10 | 1 | 11,1 | 10,1 | 10,0 | 00,1 |
| 11 | 0 | 11,1 | 01,0 | 10,0 | 11,0 |
| 11 | 1 | 11,1 | 10,1 | 01,1 | 11,0 |

| Do[1:0] | Do[1:0]_DBIo | CHANGE BIT (AT OUTPUT) |
|---|---|---|
| 11 | 00_1 | 2-1 |
| 01 | 10_1 | 1-1 |
| 10 | 10_0 | 2-1 |
| 01 | 10_1 | 2-1 |
| 11 | 00_1 | 1-1 |
| 10 | 01_1 | 1-1 |
| 10 | 01_1 | 0-0 |
| 10 | 01_1 | 0-0 |
| 11 | 00_1 | 1-1 |
| 01 | 10_1 | 1-1 |
| 10 | 10_0 | 2-1 |
| 10 | 10_0 | 0-0 |
| 01 | 10_1 | 2-1 |
| 11 | 00_1 | 1-1 |
| 10 | 01_1 | 1-1 |
| 00 | 11_1 | 1-1 |
| 11 | 11_0 | 2-1 |
| 10 | 10_0 | 1-1 |
| 10 | 10_0 | 0-0 |
| 00 | 00_0 | 1-1 |

CHANGE BIT IS REDUCED FROM 2 BIT TO 1 BIT

FIG. 4C

| D[1:0] | DBI | Do[1:0] |
|---|---|---|
| 00 | 0 | 00 |
| 00 | 1 | 11 |
| 01 | 0 | 01 |
| 01 | 1 | 10 |
| 10 | 0 | 10 |
| 10 | 1 | 01 |
| 11 | 0 | 11 |
| 11 | 1 | 00 |

SWITCHING REDUCTION BUS USING DATA BIT INVERSION WITH SHIELD LINES

BACKGROUND

FIG. 1A shows bi-directional bus driver/receiver circuit 101 having a driver circuit 103 and a receiver circuit 104 that can drive data for a long distance data bus, which data bus may be more than several millimeters. The bi-directional driver circuit 103 and receiver circuit 104 provides a bus driver/receiver, for an example 2-bit bus 105, including a Din having Din[0] and Din[1] inputs for driver circuit 103 and a Dout having Dout[0] and Dout[1] outputs for receiver circuit 104. DrvClk is coupled to latch 106-0 and tri-state buffer 108-0 to provide output timing for data input at Din[0] and output to Dbus [0], and is coupled to latch 106-1 and tri-state buffer 108-1 to provide output timing for data input at Din[1] and output to Dbus [1]. Dbus [0] and Dbus[1] are arranged as a long distance bi-directional bus 105. RcvClk controls timing to receive data from Dbus[0] of Dbus 105 and to output the received data to Dout[0] from latch 119-0 that is coupled to Dbus [0] by buffer 109-0, and to receive data from Dbus[1] of Dbus 105 and to output the received data to Dout[1] from latch 119-1 that is coupled to Dbus [1] by buffer 109-1. FIG. 1B shows the data relationship between data input to the driver and output to the bi-directional bus with respect to DrvClk rise edge, where * refers to [0] or [1]. FIG. 1C shows the data relationship between data input to the receiver from the bi-directional bus and output from the receiver with respect to RcvClk rise edge, where * refers to [0] or [1].

A current is consumed every time the data shifts from high to low or low to high on a long distance bi-directional bus such as bus 105. In a desirable data bus configuration, number of bus lines is small, for example, two for 2-bit bus 105. However, a coupling effect can occur between the data bus lines such as Dbus [0] and Dbus[1] of data bus 105, and delay and timing mismatch occurs when data on the bus lines are shifted simultaneously. This undesirable effect, from data shifting simultaneously on bus lines, decreases a data valid window and can result in malfunction in a high bandwidth application.

FIG. 2A is a block diagram of a 4-bit data bus that uses bi-directional bus driver/receiver circuits 201-1, 201-2, 201-3, and 201-4, where each of these bi-directional bus driver/receiver circuits can be structured like bi-directional bus driver/receiver circuit 101 of FIG. 1. Bi-directional bus driver/receiver circuits 201-1 and 201-3 are connected together at different edges of a long distance bi-directional bus 205 by bus Dbus[0] and Dbus[1] of bi-directional bus 205, and bi-directional bus driver/receiver circuits 201-2 and 201-4 are connected together at different edges of long distance bi-directional bus 205 by bus Dbus[2] and Dbus[3] of bi-directional bus 205. Each of bi-directional bus driver/receiver circuits 201-2 and 201-1 includes two data inputs Din[3:2] and Din[1:0], respectively, to receive data DWin [3:0] as DWin [3:2] and DWin [1:0], respectively, and output this data to Dbus[3] and Dbus[2] from bi-directional bus driver/receiver circuit 201-2 and to Dbus[1] and Dbus[0] from bi-directional bus driver/receiver circuit 201-1, respectively. Each of bi-directional bus driver/receiver circuits 201-2 and 201-1 include two data outputs Dout[3:2] and Dout[1:0], respectively, to output received data DRout [3:0] as DRout [3:2] and DRout [1:0], respectively, which data is received from Dbus[3] and Dbus[2] at bi-directional bus driver/receiver circuit 201-2 and from Dbus[1] and Dbus[0] from bi-directional bus driver/receiver circuit 201-1, respectively.

Each of bi-directional bus driver/receiver circuits 201-4 and 201-3 include two data inputs Din [3:2] and Din[1:0], respectively, to receive data DRin [3:0] as DRin [3:2] and DRin [1:0], respectively, and output this data to Dbus[3] and Dbus[2] from bi-directional bus driver/receiver circuit 201-4 and to Dbus[1] and Dbus[0] from bi-directional bus driver/receiver circuit 201-3, respectively. Each of bi-directional bus driver/receiver circuits 201-4 and 201-3 include two data outputs Dout[3:2] and Dout[1:0], respectively, to output received, data DWout [3:0] as DWout [3:2] and DWout [1:0], respectively, which data is received from Dbus[3] and Dbus[2] at bi-directional bus driver/receiver circuit 201-4 and from Dbus[1] and Dbus[0] from bi-directional bus driver/receiver circuit 201-3, respectively.

DWClk provides write timing to DrvClk of bi-directional bus driver/receiver circuits 201-2 and 201-1 and to RcvClk of bi-directional bus driver/receiver circuits 201-4 and 201-3. DRClk provides read timing to RcvClk of bi-directional bus driver/receiver circuits 201-2 and 201-1 and to DrvClk of bi-directional bus driver/receiver circuits 201-4 and 201-3.

FIG. 2B shows a wiring arrangement for long distance bi-directional bus 205. It is desirable that only 4 wiring lines for 4-bit data extend adjacently to one another as shown in FIG. 2B. However, a shield bus may be used between two data wirings due to a parasitic capacitor effect between the two data bus. On the other hand, the negative effect due to parasitic capacitance can be avoided if a shield bus is inserted as shown in FIG. 2C with a shield line on each side and running adjacent to each of Dbus[0], Dbus[1], Dbus[2], and Dbus[3] of Dbus 205. However, the current consumption is still the same as FIG. 1A.

FIGS. 3A-3B are a timing chart for random data received at a Din [1:0] of the arrangement of FIG. 2A. Only received data. Dwin [1:0] is represented, where the data Dwin [1:0] is random. In the timing shown, the number of data change of Dbus [1:0] is 22 times. Loops 311-1, 311-2, 311-3, 311-4, 311-5, 311-6 show times that represent a case in which both 2 hits of data, one bit on Dbus[1] and one hit on Dbus[0], change at the same time. In this example, there are six cases in total of simultaneous changing of values of the bits. In the six cases, the device may have malfunctions, that is, delay of data, timing mismatch, or similar unwanted effect.

In addition, the maximum number of data bus switching at the same time is the same as number of data bus. In the case of FIGS. 3A-3B, the maximum number becomes two. Considering a product using large number of data bus lines like high bandwidth memory (HEM), the maximum peak current associated with data bus switching at the same time may have a negative effect on a system or peripheral circuits. In a general view, HBM is memory technology that uses through-substrate vias (TSVs) to interconnect stacked memory die. The Joint Electron Device Engineering Council (JEDEC) Solid State Technology Association, a standards for the microelectronics industry, has published a High Bandwidth Memory (HBM) DRAM standard. In a JEDEC publication, the HBM standard provides wide input/out and TSV technologies in stacked memory devices to support high bandwidth operation, for example, support up to 8 GB per device at speeds up to 256 GB/s.

BRIEF DESCRIPTION OF THE DRAWINGS

FIGS. 4A-4C illustrate an example of a calculator to generate a data bit inversion signal onto a data bit inversion output line and associated data, according to various embodiments.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

The terms line, data line, bus line, wire line, wiring, as used herein, are electrically conductive paths that can provide propagation of a signal. Such electrically conductive paths can be implemented in a number of different forms. For example, electrically conductive paths can be, but are not limited to, conductive traces on a semiconductor chip, conductive paths on a circuit board, electrically conductive paths on or within one or semiconductor chips, discrete wires, cables, and other connecting mechanisms for communicating signals, based on the given architectural arrangement. Typically, an integrated circuit or monolithic integrated circuit is a set of electrical circuits formed on a small piece of material called a chip (such as an individual die of a processing wafer). The material is material suitable for semiconductor processing and the circuits are based on semiconductor technologies. Generally, the integrated circuit is also referred to as an IC, a chip, a microchip, or other similar term.

Data bit inversion (DBI) provides a technique in which data bits are inverted from a state to an inverted state such that power consumption of the inverted state uses less power. In addition, data bits provided to an electronic device can be accompanied by a data bit inversion signal that provides an indication to the receiving electronic device whether the data bits received by the electronic device are the actual data bits, representing specific data, or an inversion of the actual data bits. If any received data bits have been inverted as indicated by decoding of the data bit inversion signal, the electronic device can invert the data as appropriate for the system in which the electronic device is disposed.

Figures 4A, 4B:
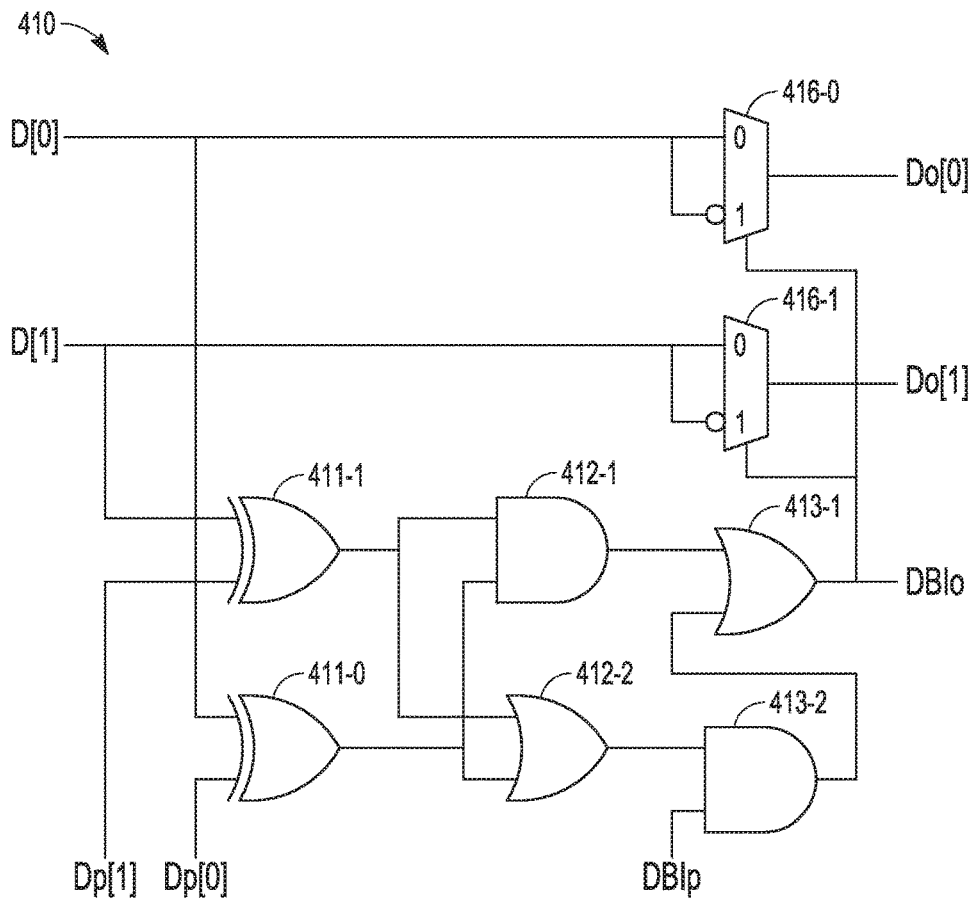

FIG. 4A is a block diagram of an embodiment of an example calculator 410 to generate a DBI signal onto a DBI output line DBIo. Calculator 410 can be configured to avoid a 2-bit data change from previous data on a data bus, such as a long distance hi-directional data bus, by comparing previous 2-bit data on the bus and currently received 2-bit data. Calculator 410 can include two outputs, Do[0] and Do[1] for data signals corresponding to two data bits of the data signals based on data bit inversion processing, where each of Do[0] and Do[1] provides data bit signals for transmission by a respective individual line of the data bus. With two bit signals of a data signal input at D[0] and D[1] coupled to latch 416-0 and latch 416-1, respectively, calculator 410 can couple the data bit signal from D[0] to Do[0] and the data bit signal from D[1] to Do[1], with these data bit signals appropriately inverted based on results of DBI calculation. Each of latches 416-0 and 416-1 can include an input from DBI output line DBIo to control whether to invert the respective data signal received at these latches. Calculator 410 can also include output line DBIo to couple to a respective individual line of the data bus to transmit a calculated DBI signal with its corresponding data bit signals.

Calculator 410 can include logic devices to calculate the data bit inversion signal using values of previous data bit signals output to two bus lines of the data bus and a value of a previous data bit inversion signal output to the data bit inversion line of the data bus. For example, calculator 410 can include an exclusive-or gate (XOR) 411-1 coupled to receive a signal from D[1] and an exclusive-or gate 411-2 coupled to receive a signal from D[0]. XOR 411-1 is also coupled to Dp[1] that inputs to XOR 411-1 a value of the previous data bit signal that was transmitted to a data bus line coupled to receive the data bit signal output by Do[1]. XOR 411-0 is also coupled to Dp[0] that inputs to XOR 411-0 a value of the previous data bit signal that was transmitted to a data bus line coupled to receive the data bit signal output by Do[0]. These connections of Dp[1] and Dp[0] relative to Do[1] and Do[0] are not shown to focus on the functional structure of calculator 410. Output of XOR. 411-1 is coupled to an input of AND gate 412-1 and to an input of OR gate 412-2. Output of XOR 411-0 is coupled to another input of AND gate 412-1 and to another input of OR gate 412-2. Output of OR gate 412-2 is coupled to an input of AND gate 413-2. AND gate 413-2 includes another input coupled to DBIp that inputs to AND gate 413-2 a value of the previous data bit inversion signal that was associated with the previous data bit signals of Dp[1] and Dp[0] and was transmitted to a data bus line coupled to receive the data bit inversion signal output by DBIo. Output of AND gate 413-2 is coupled to an input of OR gate 413-1 and output of AND gate 412-1 is coupled to another input of OR gate 413-1. Output of OR gate 413-1 is coupled to latch 416-0 and to latch 416-1 to provide a control signal to latches 416-0 and 416-1 for inversion of appropriate data bit signals for output to Do[1] and Do[0]. Output of OR gate 413-1 is coupled to DBIo to provide a current data bit inversion signal. For apparatus having a data bus that includes lines arranged for more than two bits, such apparatus can include multiple calculators where each calculator outputs two data signals and a data bit inversion signal corresponding to the two data signals. For example, for a 4-bit data bus, an apparatus can include two calculators with one calculator providing output to Do[1], Do[0], and DBI[0] and the other calculator providing output to Do[3], Do[2], and DBI[1]. Apparatus using techniques as taught herein are not limited to a 2-bit data bus or a 4-bit data bus. By a N-hit data bus, it is meant that the data bus includes N lines that carry individual data bit signals of a data signal and may include other lines for control or other communication purposes.

FIG. 4B is an output data table for two data bit signals output from calculator 410. The data signal output D[1:0] includes the input data bit signal from D[1] and the input data bit signal from D[0]. Dp[1:0] includes the previous data bit signal Dp[1] output to Do[1] and the accompanying previous data bit signal Dp[0] output to Do[0]. DBIp is the previous data bit inversion signal. The row entries showing the intersection of the values Dp[1:0], DBIp, and D[1:0] are the results of using values providing {Do[1:0],DBIo}, which are corresponding current data bit signals and DBI output from calculator 410.

FIG. 4C shows a simulation result for random data input. {Dp[1:0],DBIp} and {Do[1:0],DBIo} represents a previous one data set of {Dp[1:0],DBIp} and {Do[1:0],DBIo}. In the chart of FIG. 4C, the left column is random data and the center column is driver (calculator) output. With starting data being {Dp[1:0],DBIp}=00,0, the chart shows change of bits in the approach of FIG. 4A with respect to conventional approaches. In the approach taught herein only one bit of three bits changes. In addition, two bits are not changed simultaneously, so low data noise can be realized.

Figures 5A, 5B:
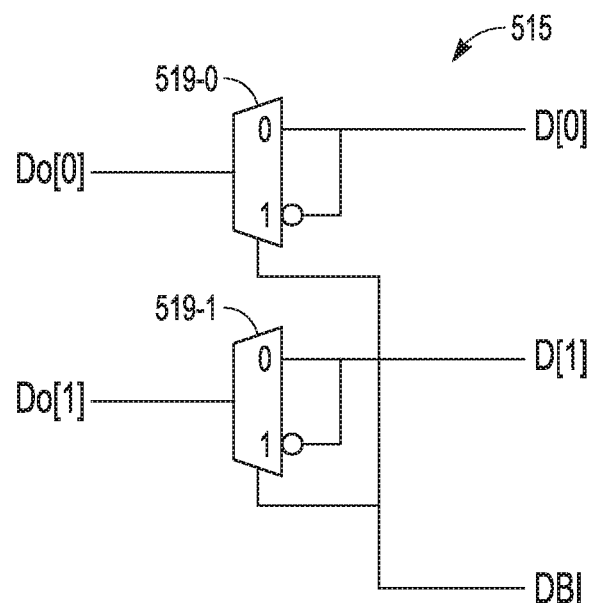
FIGS. 5A-5B illustrate an example of a two-bit data bit inversion decoder and associated data, according to various embodiments.

FIG. 5A is a block diagram of a two-bit DBI decoder 515. DBI decoder 515 includes a latch 519-1 coupled to D[1] to receive a data bit signal from a data bus and a latch 519-0 coupled to D[0] to receive another data bit signal from the data bus. Each of latch 519-1 and latch 519-0 can also be coupled to receive a DBI signal from the data bus. The DBI signal is used by latch 519-1 and latch 519-0 to invert the signals received at D[1] and D[0], respectively, depending on the value of the DBI signal. For example, received data can be inverted when the DBI signal is a DBI bit having a value of "1". DBI decoder 515 outputs a value to Do[0] based on the value from the input at D[0] and the value of DBI and outputs a value to Do[1] based on the value from the input at D[1] and the value of DBI. FIG. 5B is a table illustrating possible values the data signal D[1:0] received at DBI decoder 515 from D[1] and D[0] and possible values the DBI signal received at DBI decoder 515 and the resulting values output Do[1:0] from DBI decoder 515 to Do[1] and Do[0].

Figure 6:
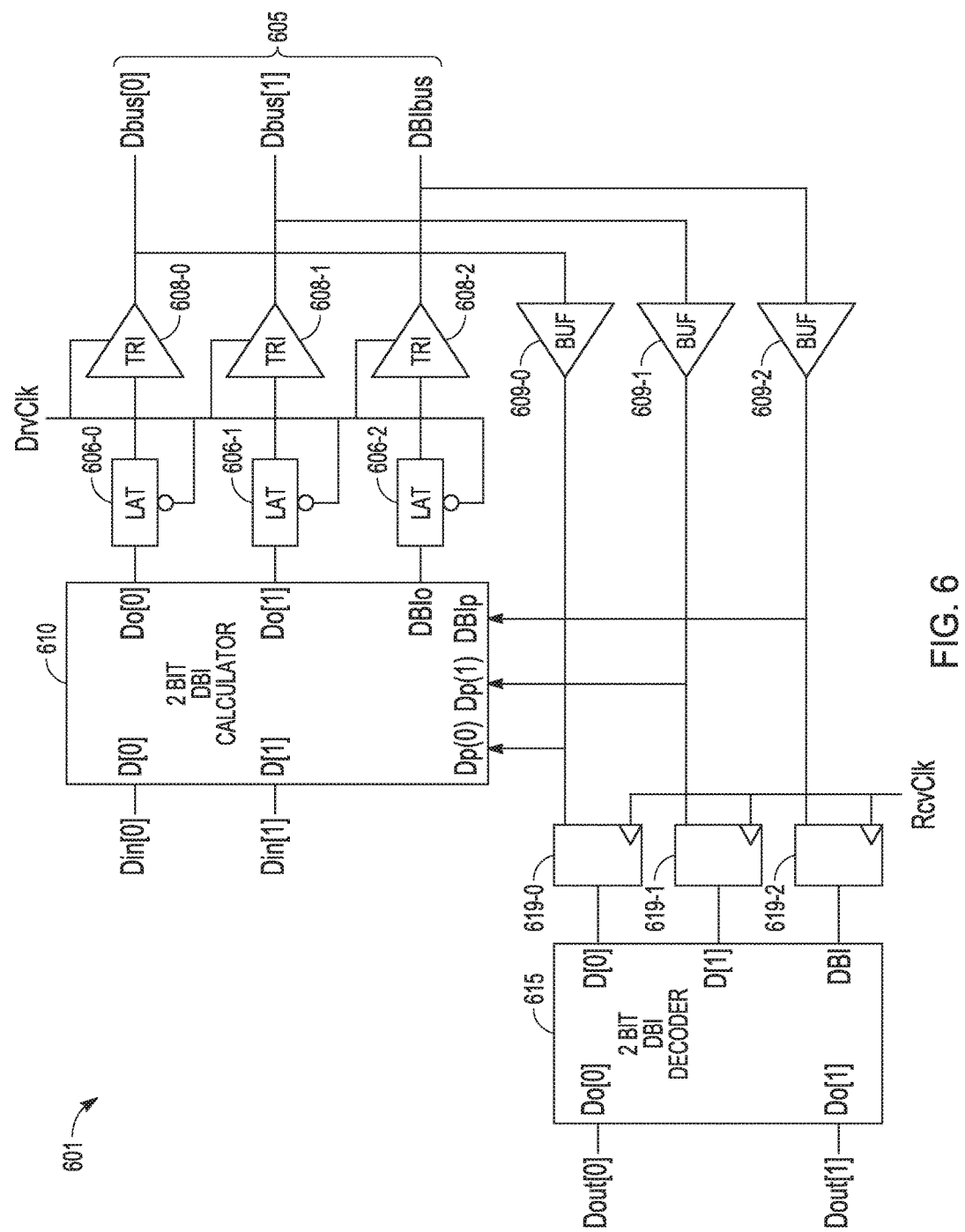
FIG. 6 is a block diagram of an example circuit configuration constructed as a combination of a data bit inversion calculator and a data bit inversion decoder, according to various embodiments.

FIG. 6 is a block diagram of a circuit configuration 601 constructed by combining a DBI calculator 610 and a DBI decoder 615. For example, circuit configuration 601 can he constructed by combining circuits shown in FIG. 4A and FIG. 5A. Circuit configuration 601 includes a driver and a receiver for a bi-directional data bus and can operate as a bi-directional bus driver/receiver circuit. DBI calculator 610, which can be structured similar or identical to calculator 410 of FIG. 4A, can work as a driver. Decoder 615, which can be structured similar or identical to decoder 515 of FIG. 5A, can work as a receiver.

DBI calculator 610, which arranged as a 2-bit DBI calculator, can act as a bus driver to a bi-directional data bus 605, for an example 2-bit data bus 605. Data bus 605 can includes data lines, Dbus[1] and Dbus[0] and DBIbus. Din[1] and Din[0] inputs for Din[1:0] are coupled to DBI calculator 610 to input signals to D[1] and D[0], respectively. DBI calculator 610 has data bit outputs Do[1] and Do[0] and has a DBIo output to provide a DBI signal associated with the data bit signals output from Do[1] and Do[0] based on the DBI calculation. Output Do[0] is coupled to latch 606-0 that is coupled to tri-state buffer 608-0, whose output is coupled to Dbus[0]. Output Do[1] is coupled to latch 606-1 that is coupled to tri-state buffer 608-1, whose output is coupled to Dbus[1]. Output DBIo is coupled to latch 606-2 that is coupled to tri-state buffer 608-2, whose output is coupled to DBIbus. DrvClk is coupled to latch 606-0 and tri-state buffer 608-0 to provide output timing for data output from Do[0] to Dbus[0] of data bus 605. DrvClk is also coupled to latch 606-1 and tri-state buffer 608-1 to provide output timing for data output from Do[1] to Dbus[1] of data bus 605. DrvClk is also coupled to latch 606-2 and tri-state buffer 608-2 to provide output timing for DBI from DBIo to DBIbus of data bus 605.

DBI decoder 615, which arranged as a 2-bit DBI decoder, can act as a receiver for a bi-directional data bus 605. A buffer 609-0 is coupled to Dbus [0] of data bus 605 to receive a data bit signal. The output of buffer 609-0 is coupled to latch 619-0, whose output is coupled to input D[0] of DBI decoder 615. A buffer 609-1 is coupled to Dbus [1] of data bus 605 to receive a data bit signal. The output of buffer 609-1 is coupled to latch 619-1, whose output is coupled to input D[1] of DBI decoder 615. A buffer 609-2 is coupled to DBIbus of data bus 605 to receive a data bit inversion signal. The output of buffer 609-2 is coupled to latch 619-2, whose output is coupled to input DBI of DBI decoder 615. RcvClk is coupled to latch 619-0 to control timing of received data at latch 619-0 from Dbus[0] of Dbus 605 and to output the received data to D[0] of DBI decoder 615. RcvClk is also coupled to latch 619-1 to control timing of received data at latch 619-1 from Dbus[1] of Dbus 105 and to output the received data to D[0] of DBI decoder 615. RcvClk is also coupled to latch 619-2 to control timing of received data bit inversion signal at latch 619-2 to DBI of DBI decoder 615. DBI decoder 615 has an output Do[0] coupled to Dout[0] to output a received data bit signal to Dout[0] based on the decoding by DBI decoder 615. DBI decoder 615 also has an output Do[1] coupled to Dout[1] to output another received data bit signal to Dout[1] based on the decoding by DBI decoder 615.

DBI calculator 610 can include logic devices to calculate the data bit inversion signal using values of previous data bit signals output to two bus lines of the data bus and a value of a previous data bit inversion signal output to the data bit inversion line of the data bus. DBI calculator 610 has an input Dp[0] to receive a previous data bit signal coupled to Dbus[0] and input Dp[0] is coupled to buffer 609-0 to receive this previous data bit signal. DBI calculator 610 has an input Dp[1] to receive a previous data bit signal coupled to Dbus[1] and input Dp[1] is coupled to buffer 609-1 to receive this previous data bit signal. DBI calculator 610 has an input DBIp to receive a previous data bit inversion signal coupled to DBIbus and input DBIp is coupled to buffer 609-2 to receive this previous data bit inversion signal.

For apparatus having a data bus that includes lines arranged for more than two bits, such apparatus can include multiple bi-directional bus driver/receiver circuits, where each bi-directional bus driver/receiver circuit includes a 2-bit DBI calculator that outputs two data bit signals and a data bit inversion signal corresponding to the two data bit signals to the data bus, and a 2-bit decoder to receive two data bit signals from the data bus and to use a received DBI signal to convert the received two data bit signals to their proper values. For example, for a 4-bit data bus, an apparatus can include, at an end of a data bus, two bi-directional bus driver/receiver circuits, where each bi-directional bus driver/receiver circuit has a 2-bit DBI calculator with the DBI calculator of one bi-directional bus driver/receiver circuit providing, to the data bus, Do[1] and Do[0] of data signal Do[3:0], and DBI[0], and the two-bit calculator of the other bi-directional bus driver/receiver circuit providing, to the data bus, Do[3] and Do[2] of data signal Do[3:0], and DBI[1] to the data bus. Apparatus using techniques as taught herein are not limited to a 2-bit data bus or a 4-bit data bus.

Figure 7A:
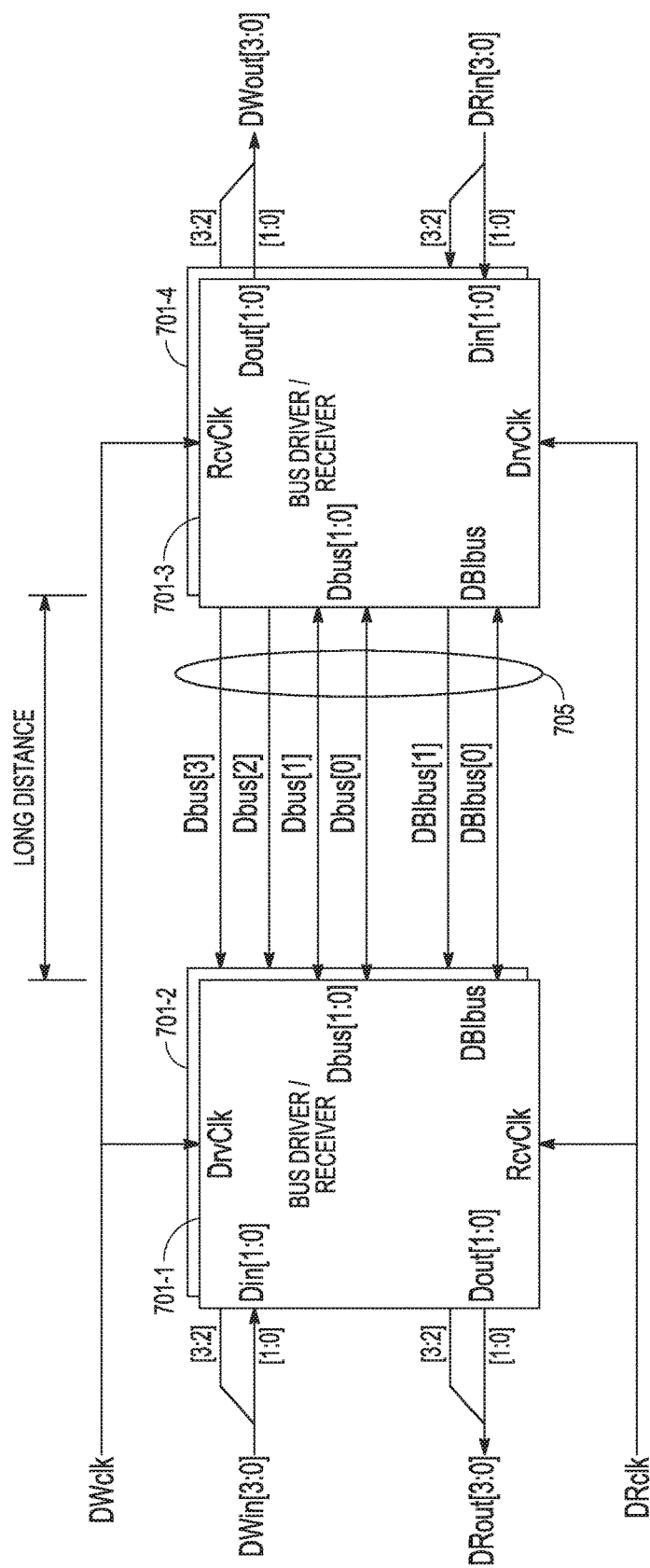
FIGS. 7A-7C illustrate an example of a four-bit data bus that uses bi-directional bus driver/receiver circuits that can be implemented similar to the circuit configuration of FIG. 6, according to various embodiments.

FIG. 7A is a block diagram of an embodiment of an example of a 4-bit data bus 705 that uses bi-directional bus driver/receiver circuits that can be implemented similar to the circuit configuration 601 of FIG. 6. As shown in FIG. 7A, bi-directional bus driver/receiver circuits 701-1, 701-2, 701-3, and 701-4 are provided at both sides of the long distance bi-directional bus 705 with bi-directional bus driver/receiver circuits 701-1 and 701-3 coupled together at different edges of long distance bi-directional bus 705 by bus Dbus[0] and Dbus[1] of bi-directional bus 705, and with bi-directional bus driver/receiver circuits 701-2 and 701-4 coupled together at different edges of long distance bi-directional bus 705 by bus Dbus[2] and Dbus[3] of bi-directional bus 205. Bi-directional bus 705 includes DBIbus [0] and DBIbus[1] to propagate DBI signals between bi-directional bus driver/receiver circuits 701-1 and 701-3 and between bi-directional bus driver/receiver circuits 701-2 and 701-4, respectively. Bi-directional bus 705 includes lines for four bits and two DBI hits in a bundle of lines for hi-directional bus 705. Bi-directional bus 705 can include shield lines as shown in FIG. 7C.

Each of bi-directional bus driver/receiver circuits 701-2 and 701-1 include two data inputs Din[3:2] and Din[1:0], respectively, to receive data DWin [3:0] as DWin [3:2] and DWin [1:0], respectively, and output associated data to Dbus[3] and Dbus[2] from bi-directional bus driver/receiver circuit 701-2 and to Dbus[1] and Dbus[0] from bi-directional bus driver/receiver circuit 701-1, respectively. The associated data can be based on DBI calculation with respect to data received at Din[3:2] and Din[ 1:0], respectively. Each of bi-directional bus driver/receiver circuits 701-2 and 701-1 include two data outputs Dout[3:2] and Dout[1:0], respectively, to output received data DRout [3:0] as DRout [3:2] and DRout [1:0], respectively, which data is received from Dbus[3] and Dbus[2] at bi-directional bus driver/receiver circuit 701-2 and from Dbus[1] and Dbus[0] from bi-directional bus driver/receiver circuit 701-1, respectively.

Each of bi-directional bus driver/receiver circuits 701-4 and 701-3 include two data inputs Din [3:2]and Din[1:0], respectively, to receive data DRin [3:0] as DRin [3:2] and DRin [1:0], respectively, and output associated data to Dbus[3] and Dbus[2] from bi-directional bus driver/receiver circuit 701-4 and to Dbus[1] and Dbus[0] from bi-directional bus driver/receiver circuit 701-3, respectively. The associated data can be based on DBI calculation with respect to data received at Din[3:2] and Din[ 1:0], respectively. Each of bi-directional bus driver/receiver circuits 701-4 and 701-3 include two data outputs Dout[3:2] and Dout[1:0], respectively, to output data DWout [3:0] as DWout [3:2] and DWout [1:0], respectively, which data is received from Dbus[3] and Dbus[2] at bi-directional bus driver/receiver circuit 701-4 and from Dbus[1] and Dbus[0] from bi-directional bus driver/receiver circuit 701-3, respectively.

DWClk provides write timing to DrvClk of bi-directional bus driver/receiver circuits 701-2 and 701-1 and to RcvClk of bi-directional bus driver/receiver circuits 701-4 and 701-3. DRClk provides read timing to RcvClk of bi-directional bus driver/receiver circuits 701-2 and 701-1 and to DrvClk of bi-directional bus driver/receiver circuits 701-4 and 701-3.

Figure 7B:
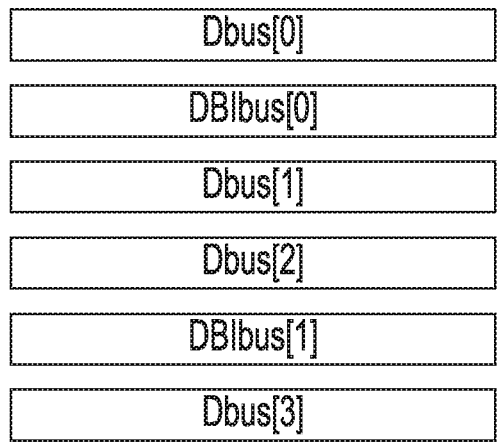
Figure 7C:
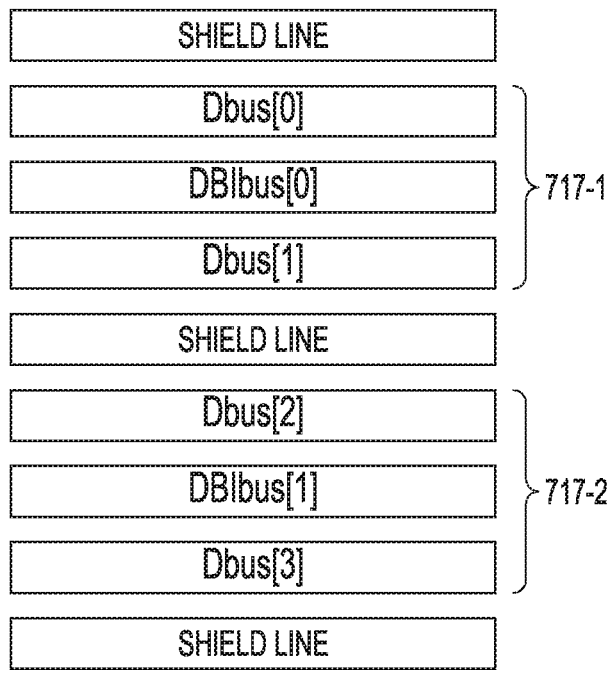

FIG. 7B shows a wiring arrangement for long distance bi-directional bus 705. It is desirable that only 6 wiring lines for 4-bit data signals and two DBI signals extend adjacently to one another as shown in FIG. 7B. Each of the two DBI signals can be disposed between two data bus lines such that no data bus line carrying data is directly adjacent another data bus line carrying data. DBIbus[0] can be disposed between Dbus[0] and Dbus[1], and DBIbus[1] can be disposed between Dbus[2] and Dbus[3]. However, a shield bus may be used between data wirings due to a parasitic capacitor effect between data wirings. On the other hand, the negative effect due to parasitic capacitance can be avoided if a shield bus is inserted as shown in FIG. 7C with a shield line on each side of a bundle of bus lines carrying data. The 6 wiring lines of FIG. 7B can be arranged with two bus lines for two data bit signals pus a bus line for a DBI bit signal comprising two bundles of the data bus with both sides of the bundles shielded as shown in FIG. 7C. One bundle 717-1 can include Dbus[0], DRIbus[0], and Dbus[1] with one shield line on each side of bundle 717-1. Another bundle 717-2 can include Dbus[2], DBIbus[1], and Dbus[3] with one shield line on each side of bundle 717-2. The two bundles 717-1 and 717-2 can share a shield line. In addition, a repeater circuit can be inserted in the architecture shown in FIG. 7A keeping logic of Dbus and DBIbus.

Figure 8A:
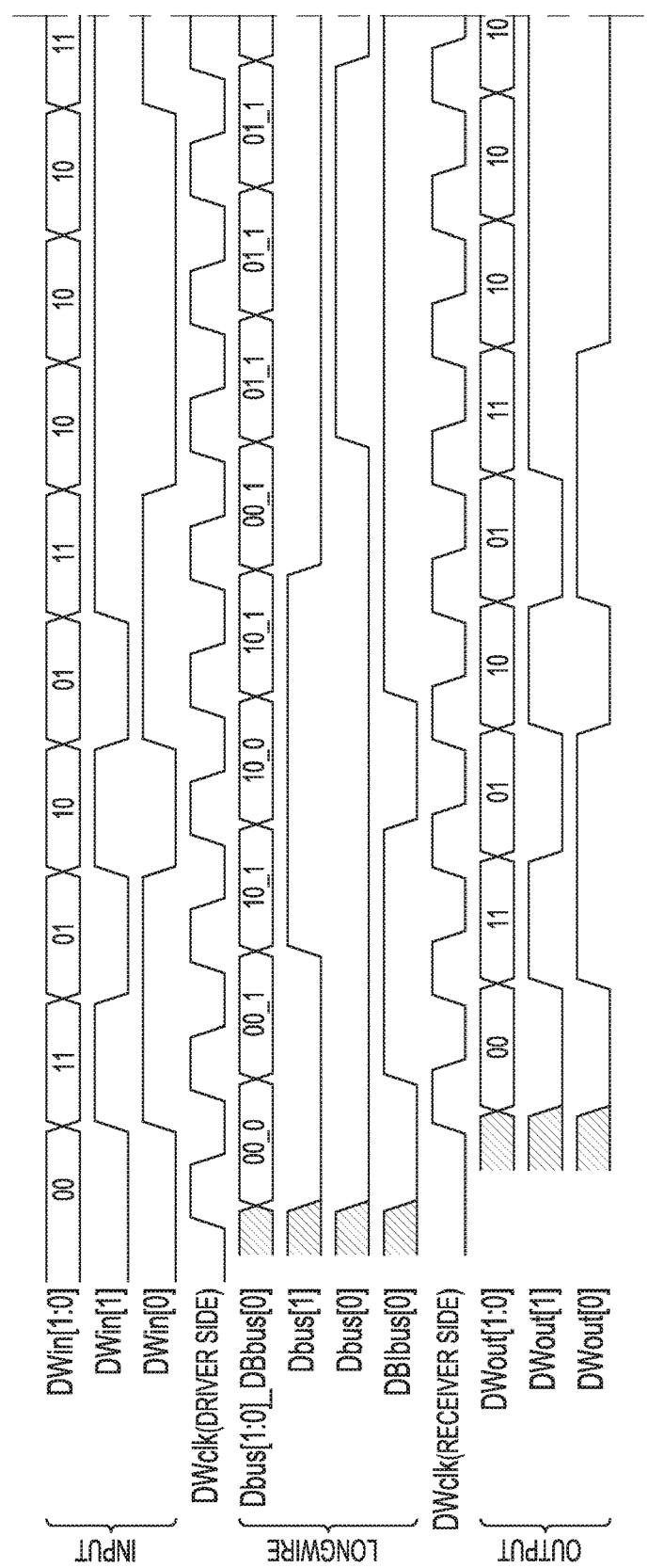
FIGS. 8A-8B are a timing chart for random data received at a data input of the arrangement of FIG. 7A, according to various embodiments.
Figure 8B:
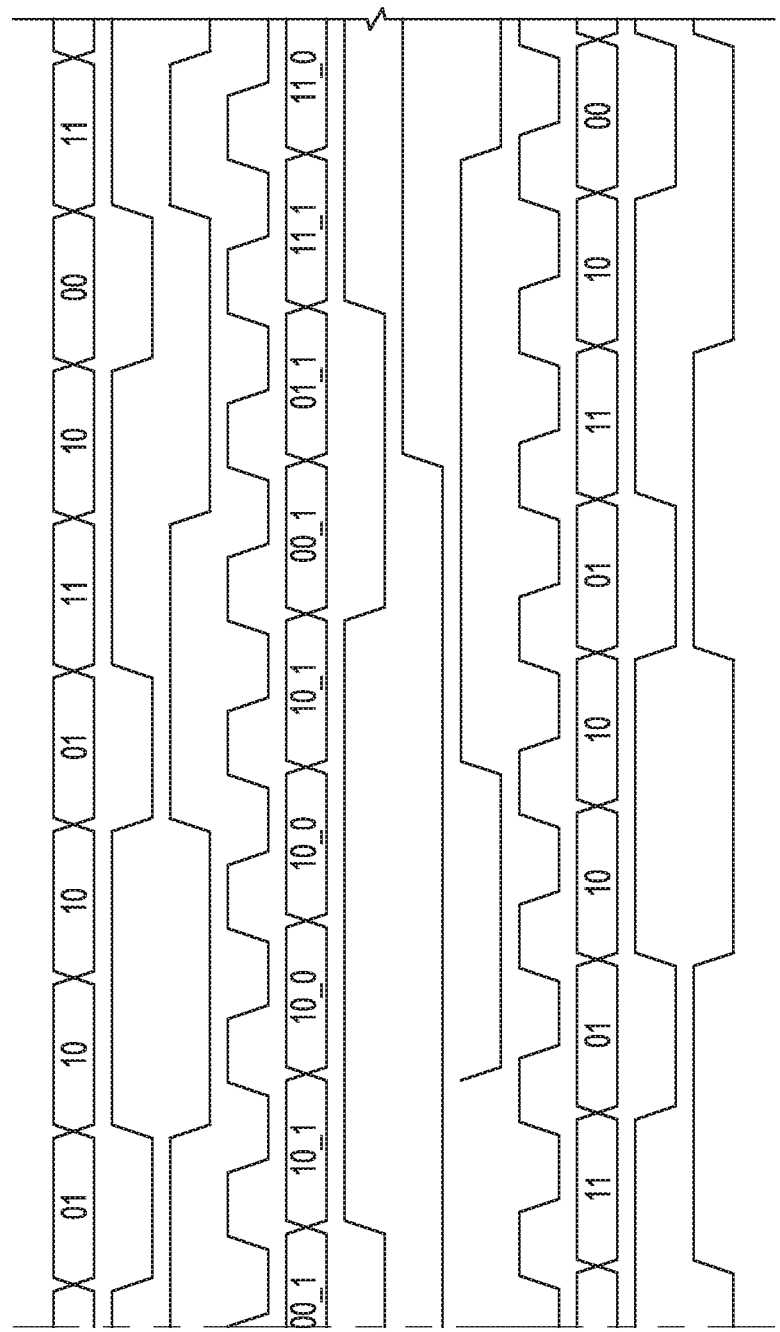

FIGS. 8A-8B are a timing chart for random data received at a Din [1:0] of the arrangement of FIG. 7A. Though FIGS. 8A-8B focus only on Dwin [1:0], Dwin [3:2] shows the same character. In this example with Dwin [1:0] is random, adjacent bus never changes its data simultaneously. As shown in FIGS. 8A-8B, it becomes possible that an enhanced coupling noise is not occurred because data of adjacent two data bus lines does not change at the same time. Based on random data, the current is consumed in proportion of the data change on the data bus and, in such a situation, maximum current consumption can be reduced about by 25%. A delay effect becomes minimum because the DBI calculation is only for the 2 bit lines, which is easier logic to implement with small delay.

Figures 1A, 1B, 1C:
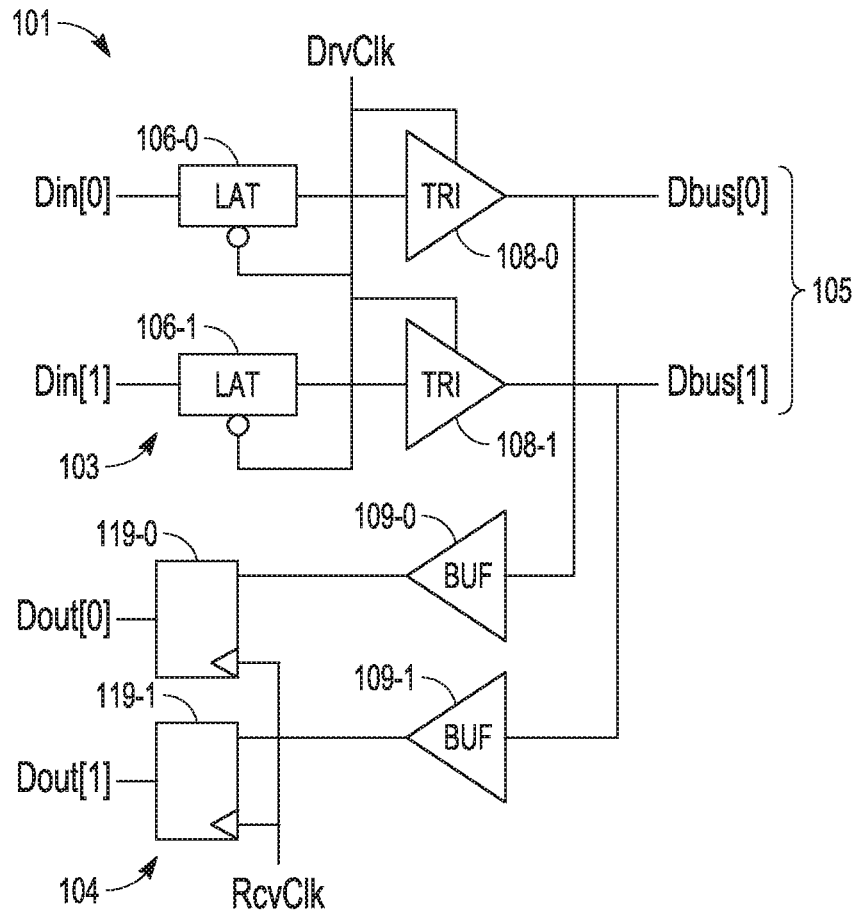
FIGS. 1A-1C illustrate features of a bi-directional bus driver/receiver circuit for a two-bit data bus and associated data, according to various embodiments.
Figure 2A:
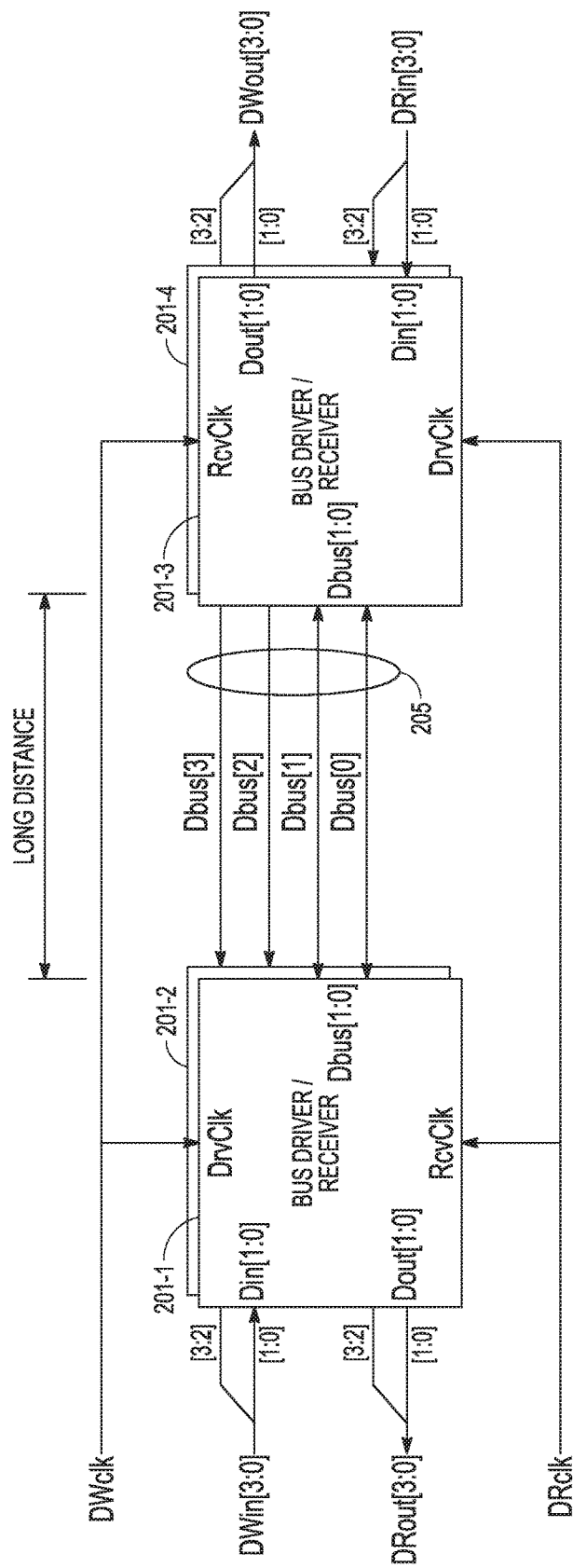
FIGS. 2A-2C illustrate a four-bit data bus that uses bi-directional bus driver/receiver circuits structured like bi-directional bus driver/receiver circuit of FIG. 1A and associated wiring.
Figure 2B:
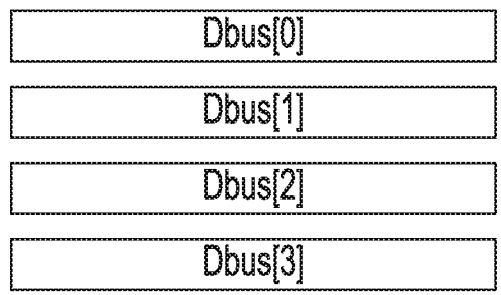
Figure 2C:
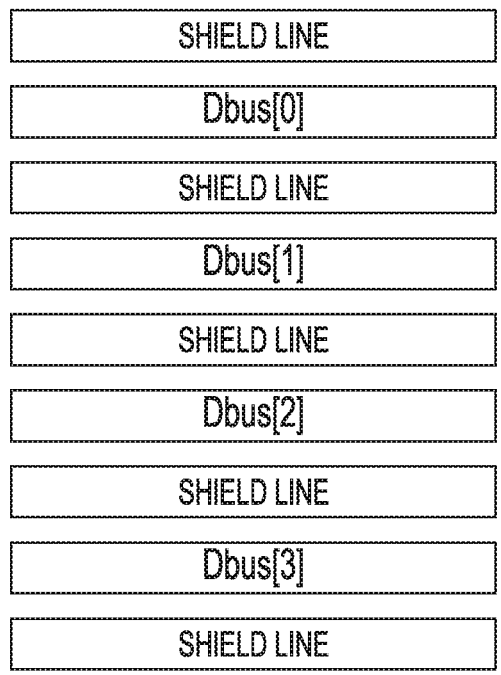
Figure 3A:
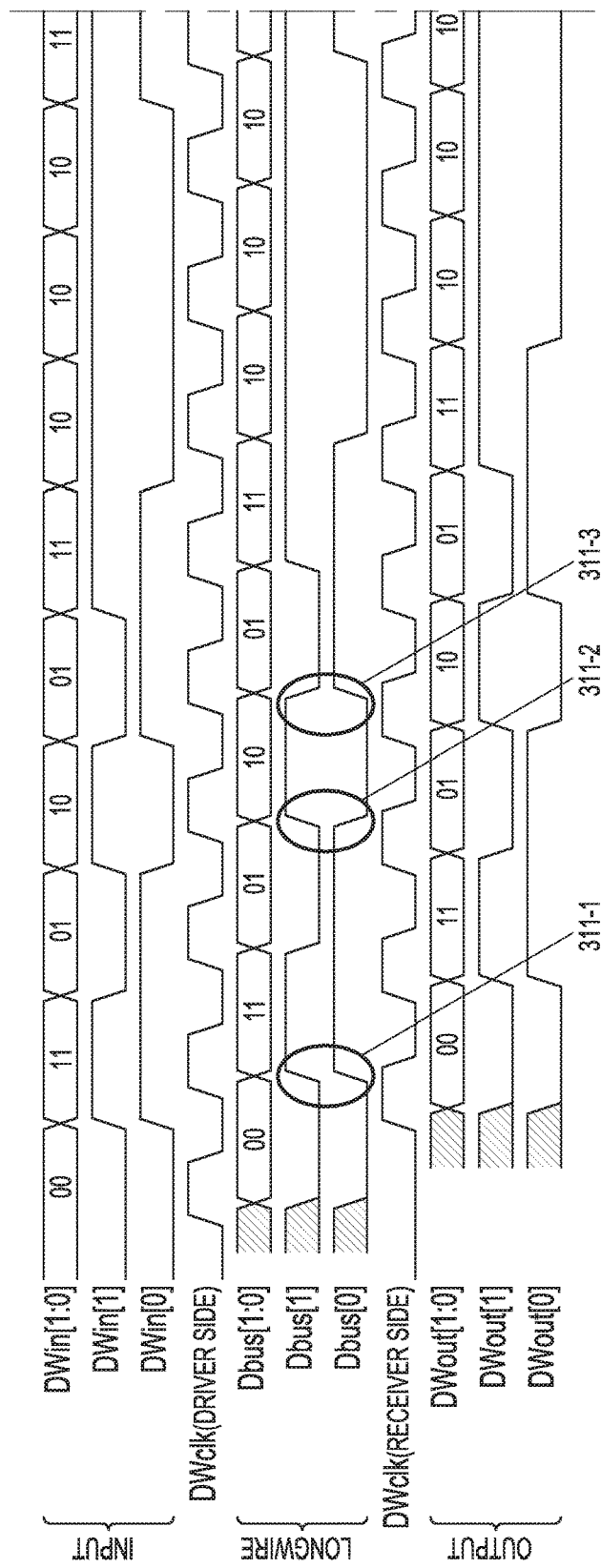
FIGS. 3A-3B are a timing chart for random data received at two data inputs of the arrangement of FIG. 2A.
Figure 3B:
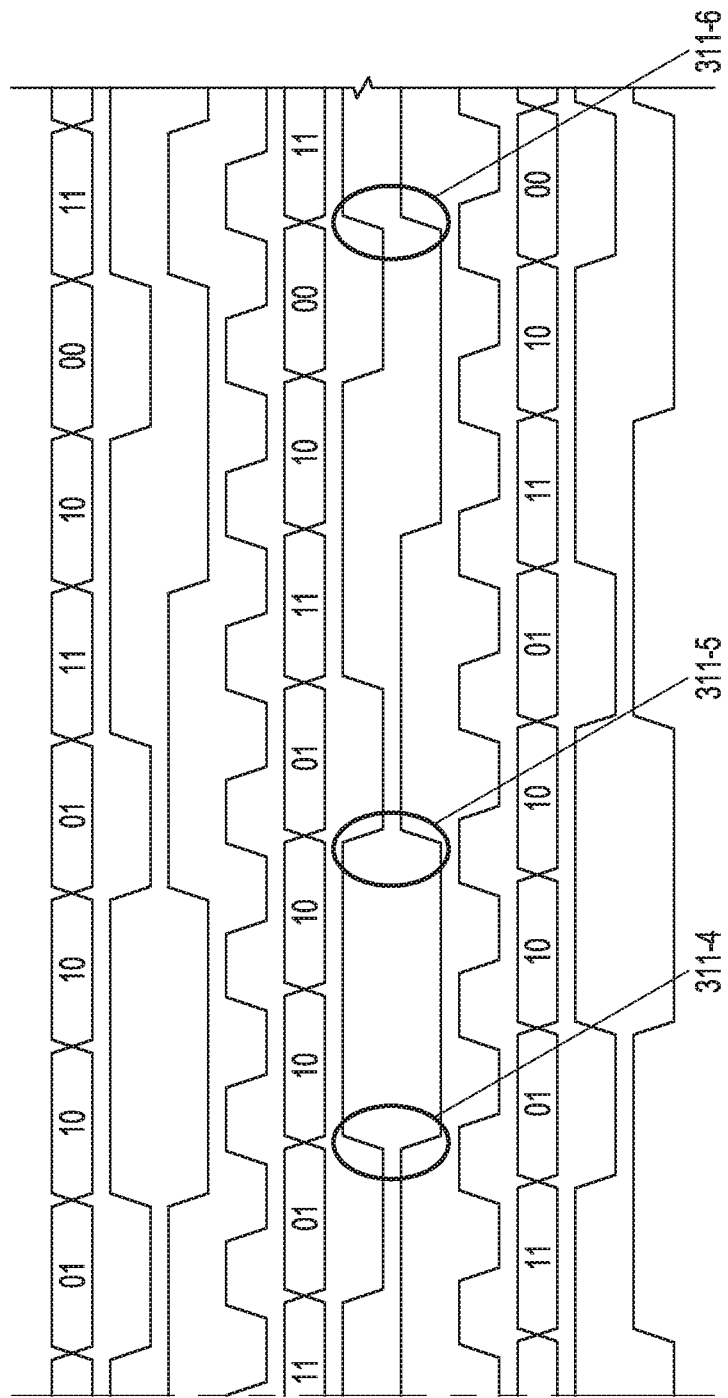

The number of changed data becomes 16 times in this example. Compared with the 22 changes of FIGS. 3A-3B, logically, a current consumption is reduced by approximately 25%. Considering all the data bus lines, the number of data bus changing its data simultaneously becomes halved as compared to the arrangement associated with FIGS. 3A-3B, since an amount of noise can be halved because the number of data bus lines simultaneously changing its data can be halved due to DBI.

Such effects can be beneficial for HBM, because HBM includes large number of data bus lines. In addition, architectures for bus driver/receiver circuits and data buses, as taught herein, and the operational enhancements of such architectures can be implemented without an increase in the number of bus lines compared to conventional approaches, can maintain signal integrity, can reduce current consumption by avoiding coupling effects and providing an effect to reduce a current using a DBI bit.

Figure 9:
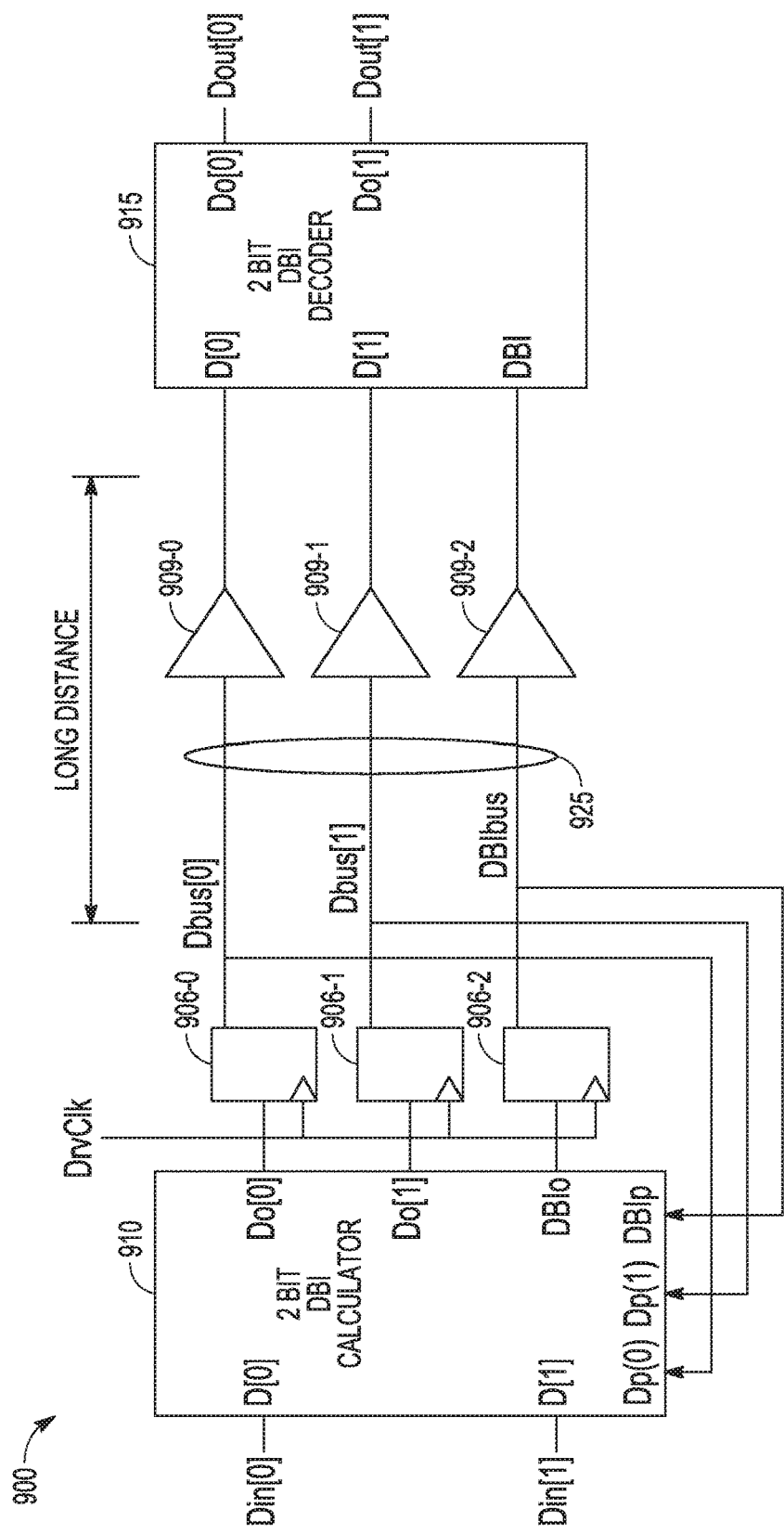
FIG. 9 is a block diagram of an example architecture for a uni-directional bus using data bit inversion, according to various embodiments.

FIG. 9 is a block diagram of an embodiment of an example architecture 900 for a uni-directional bus 925 using a DBI. Architecture 900 includes a DBI calculator 910 as a driver at one end of uni-directional bus 925 and a DBI decoder 915 as a receiver at another end of uni-directional bus 925, where the receiver is arranged to receive data signals from DBI calculator 910. Uni-directional bus 925 can include data lines, Dbus[1] and Dbus[0], and DBIbus.

DBI calculator 910, which arranged as a 2-bit DBI calculator, can have data bit outputs Do[1] and Do[0] and can have a DBIo output to provide a DBI signal associated with the data bit signals output from Do[1] and Do[0]. Data signals received at D[0] and D[1] from Din[0] and Din[1], respectively, are operated on by DBI calculator 910 to provide associated data bit signals at Do[0] and Do[1], respectively. Output Do[0] is coupled to latch 906-0, whose output is coupled to Dbus[0]. Output Do[1] is coupled to latch 906-1, whose output is coupled to Dbus[1]. Output DBIo is coupled to latch 906-2, whose output is coupled to Dalbus. DrvClk is coupled to latch 906-0 to provide output timing for data output from Do[0] to Dbus[0] of data bus 925. DrvClk is also coupled to latch 906-1 to provide output timing for data output from Do[1] to Dbus[1] of data bus 925. DrvClk is also coupled to latch 906-2 to provide output timing for DBI from DBIo to DBIus of data bus 925.

DBI decoder 915, which arranged as a 2-bit DBI decoder, can act as a receiver for a uni-directional data bus 925. A buffer 909-0 is coupled to Dbus [0] of data bus 925 to receive a data bit signal. The output of buffer 909-0 is coupled to input D[0] of DBI decoder 915. A buffer 909-1 is coupled to Dbus [1] of data bus 925 to receive a data bit signal. The output of buffer 909-1 is coupled to input D[1] of DBI decoder 915. A buffer 909-2 is coupled to DBIbus of data bus 925 to receive a data bit inversion signal. The output of buffer 909-2 is coupled to input DBI of DBI decoder 915.

DBI calculator 910 can include logic devices to calculate the data bit inversion signal using values of previous data bit signals output to two bus lines of the data bus and a value of a previous data bit inversion signal output to the data bit inversion line of the data bus. DBI calculator 910 has an input Dp[0] to receive a previous data bit signal coupled to Dbus[0] and input Dp[0] is coupled to the output of latch 906-0 to receive this previous data bit signal. DBI calculator 910 has an input Dp[1] to receive a previous data bit signal coupled to Dbus[1] and input Dp[1] is coupled to the output of latch 906-1 to receive this previous data bit signal. DBI calculator 910 has an input DBIp to receive a previous data bit inversion signal coupled to DBIbus and input DBIp is coupled to the output of latch 906-2 to receive this previous data bit inversion signal.

For an apparatus having a uni-directional data bus that includes lines arranged for more than two bits, such apparatus can include multiple drivers and multiple receivers paired at opposite ends of the uni-directional bus, where each driver includes a 2-bit DBI calculator that outputs two data bit signals and a data bit inversion signal corresponding to the two data bit signals to the data bus, and each receiver includes a 2-bit decoder to receive two data bit signals from the uni-directional bus and to use a received DBI signal to convert the received two data bit signals to their proper values. For example, for a 4-bit uni-directional data bus, an apparatus can include, at an end of a data bus, two driver circuits, where each driver has a 2-bit DBI calculator with the DBI calculator of one driver, to the uni-directional data bus, Do[1] and Do[0] of data signal Do[3:0], and DBI[0], and the two-bit calculator of the other driver circuit providing, to the data bus, Do[3] and Do[2] of data signal Do[3:0], and DBI[1] to the uni-directional data bus. Apparatus using techniques as taught herein are not limited to a 2-bit uni-directional data bus or a 4-bit uni-directional data bus.

Figure 10:
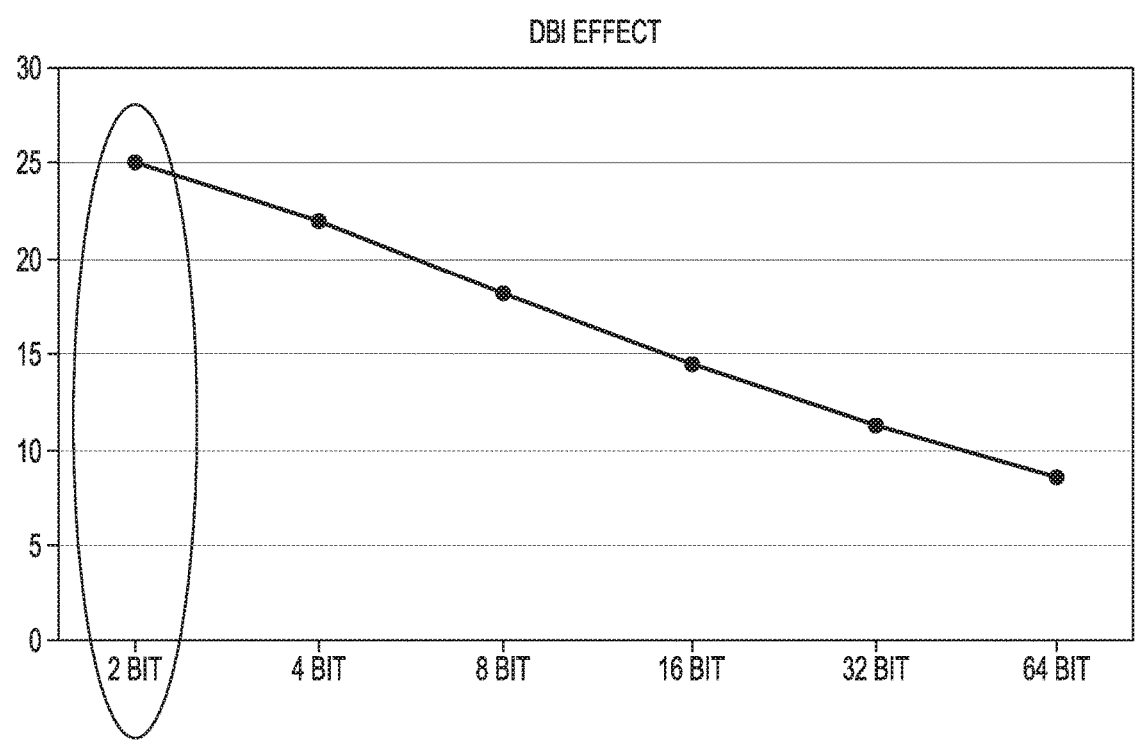
FIG. 10 is a graph of a comparison of current consumption between a case applying data bit inversion to a 64-bit data bus and another case not applying data bit inversion to a 64-bit data bus, according to various embodiments.

FIG. 10 is a graph of a comparison of current consumption between a case applying DBI to a 64-bit data bus and another case not applying DBI to a 64-bit data bus. Input data is 64 bit×random 100000 data in both cases. Number of bits arranged along a horizontal line represents number of bundle of bits to which DBI applies. Using DBI bit can increase an effect on current reduction. The effect of the current reduction is in reverse proportion to number of data bus lines. In the 2-bit case, the current consumption is reduced by approximately 25%.

Figure 11A:
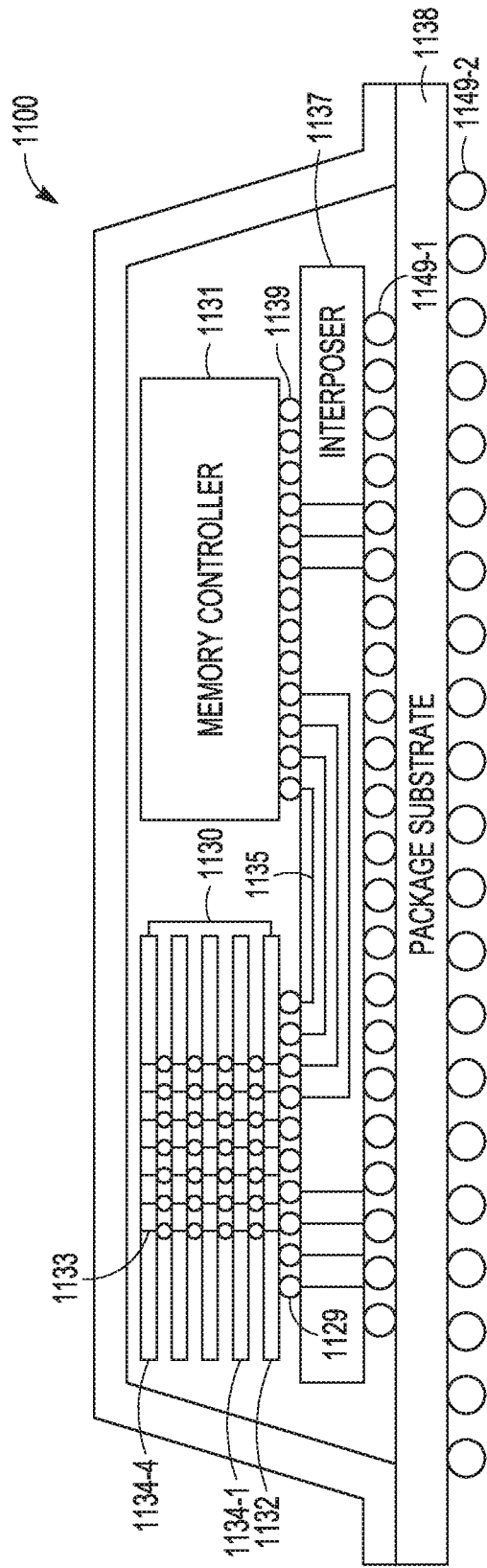
FIGS. 11A-11C illustrate features of an example electronic package including a high bandwidth memory, according to various embodiments.

FIG. 11A is a cross-sectional overview of an electronic package 1100 including a HBM 1130. HBM 1130 can include core chips 1134-1 1134-4. Though four core chips are shown in FIG. 11, HBM 1130 can include more or less than four core chips. One or more of core chips 1134-1 . . . 1134-4 can include a plurality of memory cells. Core chips 1134-1 . . . 1134-4 may he stacked on an interface chip 1132. Interface chip 1132 may be realized as a logic die. The logic die may control access to and from core chips 1134-1 . . . 1134-4. The logic die may control maintenance of the core chips 1134-1 . . . 1134-4. Interface chip 1132 can include first and second TSVs 1133 electrically coupled to core chips 1134-1 . . . 1134-4. For example, interface chip 1132 can include first and second through substrate vias 1133 electrically coupled to core chip 1134-1 and first and second micro bumps 1129. Interface chip 1132 can include conductive lines arranged with adjacent shield lines, as taught herein, coupled between the first and second through substrate vias 1133 and the first and second micro humps 1129, respectively.

Electronic package 1100 can include a package substrate 1138 having electrical connections 1149-1 and 1149-2 on opposite sides of package substrate 1138. Electrical connections 1149-2 electrically couple electronic package 1100 to electrical devices exterior to electronic package 1100. Electrical connections 1149-1 electrically couple devices within electronic package 100 to package substrate 1138 to couple to electrical connections 1149-2 for interaction with electrical devices exterior to electronic package 1100 and may couple electrical devices within electronic package 1100 to other electrical devices within electronic package 1100. Additional coupling of electrical lines can be realized by an interposer 1137 disposed on package substrate 1138 with electrical connections 1149-1 contacting and coupling interposer 1137 and package substrate 1138. Electrical connections 1149-1 and electrical connections 1149-2 may be realized by conductive contact bumps.

HBM 1130 can be disposed on interposer 1137 with electrical connections 1129 coupling and contacting EBM 1130 to interposer 1137. Electrical connections 1129 provide conductive paths from the components of HBM 1130 to interposer 1137 that allows for electrical communication exterior to electronic package 1100 using electrical connections 1149-1 and 1149-2. Electrical connections 1129 can also provide conductive paths from the components of HBM 1130 to other electronic devices within electronic package

1100. For example, electronic package 1100 can include a memory controller 1131 electrically coupled to and disposed on interposer 1137 by electrical connections 1139. Electrical connections 1129 and 1139 can be realized as conductive contact micro-bumps. Between electrical connections 1129 and 1139, interposer 1137 can include a number of lines 1135 operatively coupling memory controller 1131 with memory devices of HBM 1130. Lines 1135 can be arranged to include a data bus having data lines with shield lines structured with drivers and receivers, as taught herein.

Figure 11B:
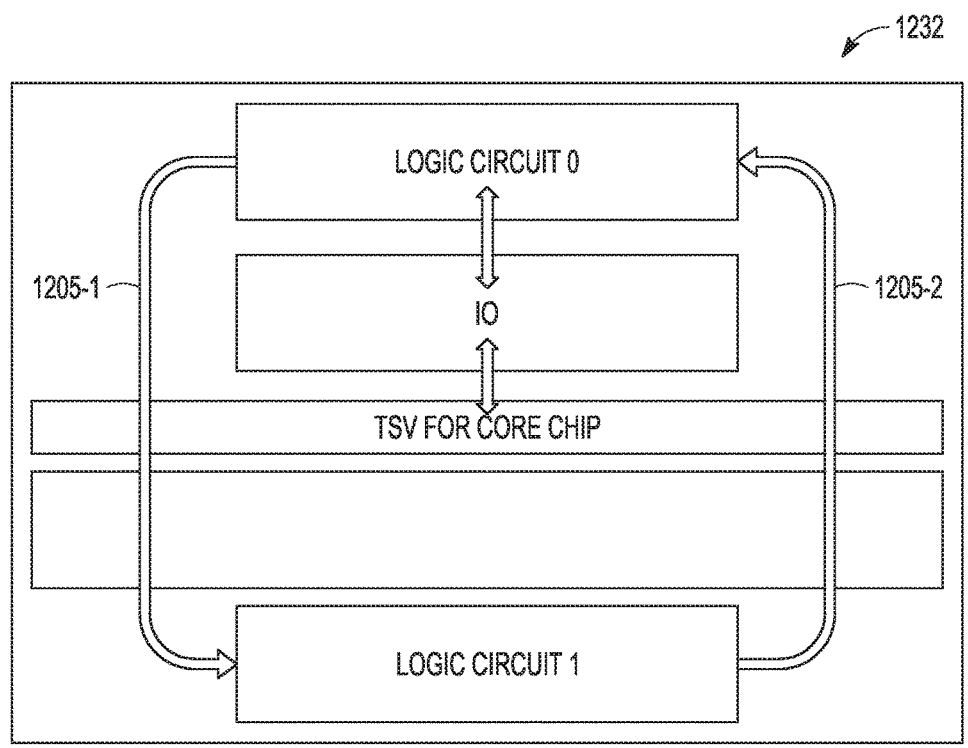

FIG. 11B is a representation of an interface chip 1232 that can be implemented as interface chip 1132 of FIG. 11A. The view of interface chip 1232 is perpendicular to the direction of the chips in the stack of HBM 1130. Interface chip 1232 can include TSVs for core chips stacked above interface chip 1232 and IO connections, such as micro-bumps, in a center region of interface chip 1232. This center region can include circuitry for address, command and data signals. Such circuitry can take up a considerable amount of area in the center region. Since logic circuits are typically large due to having many functions, interface chip 1232 can include a first logic circuit, logic circuit 0, arranged along a first side of interface chip 1232 and a second logic circuit, logic circuit 1, arranged along a second side of interface chip 1232 opposite the first side. Interface chip 1232 can include data lines with shield lines 1205-1 and 1205-2, as taught herein, where data lines with shield lines 1205-1 and 1205-2 are coupled between logic circuit 0 and logic circuit 1 for communicating data between logic circuit 0 and logic circuit 1. Data lines with shield lines 1205-1 can include a bundle of lines differing in number from the lines of 1205-2. Alternatively, a core chip such as core chip 1134-1 of HBM 1130 of FIG. 11A can include a plurality of memory cells and can include a first logic circuit arranged along a first side of the core chip and a second logic circuit arranged along a second side of the core chip opposite to the first side, where data lines with shield lines, as taught herein, can be disposed in the core chip and coupled between the first logic circuit and the second logic circuit for communicating data between these logic circuits.

Figure 11C:
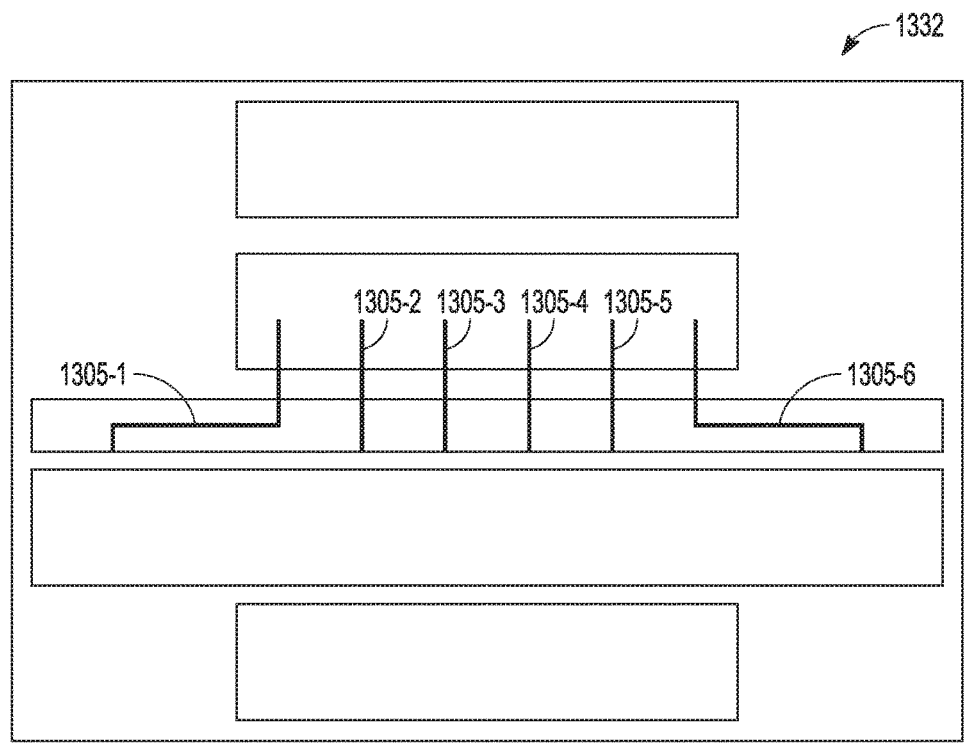

FIG. 11C is a representation of an interface chip 1332 that can be implemented as interface chip 1132 of FIG. 11A or interface chip 1232 of FIG. 11B. The view of interface chip 1332 is perpendicular to the direction of the chips in the stack of HBM 1130 of FIG. 11A. Interface chip 1332 can include data lines with shield lines 1305-1, 1305-2, 1305-3, 1305-4, 1305-5, and 1305-6, as taught herein, to transfer data, such as memory data, address, command, etc, between IO such as conductive contact micro bumps and to TSVs to couple to chips stacked above interface chip 1332.

Figure 12:
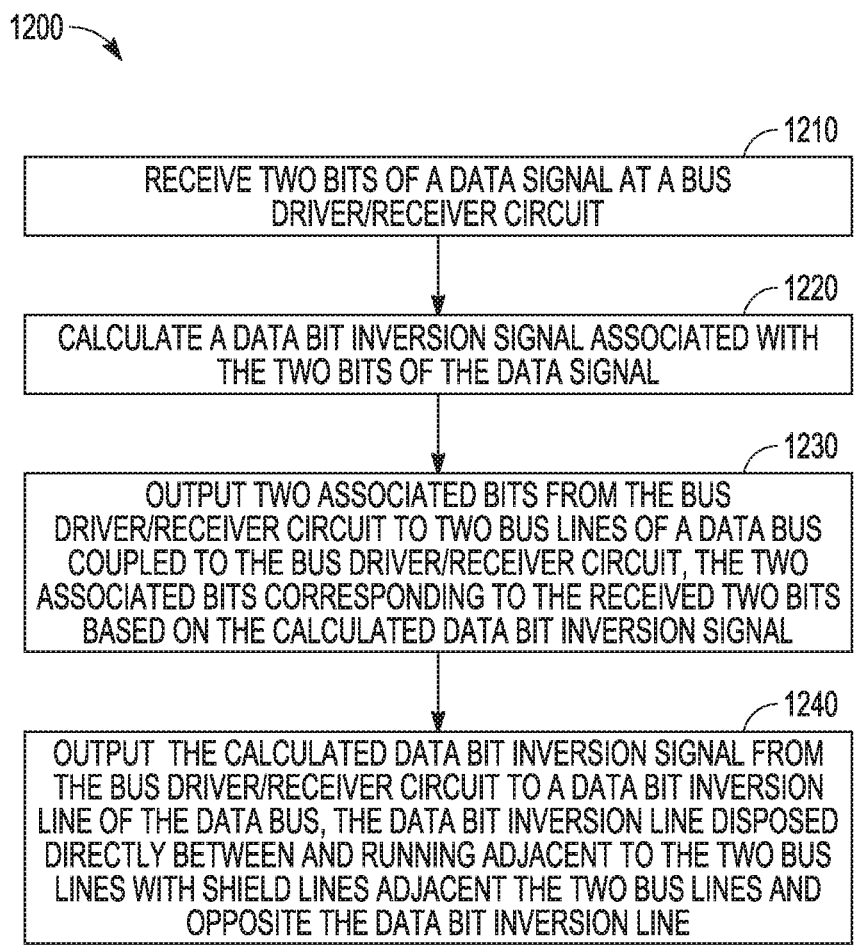
FIG. 12 is a flow diagram of features of an example method of using a data bus with shield lines adjacent data lines, according to various embodiments.

FIG. 12 is a flow diagram of features of an embodiment of example method 1200 of using a data bus with shield lines adjacent data line. At 1210, two bits of a data signal are received at a bus driver/receiver circuit. Receiving the two bits of the data signal and outputting the two associated bits from the bus driver/receiver circuit to two bus lines of the data bus can include receiving the two bits as two bits of a four bit data signal and coupling the two associated bits, as an associated two bit data signal of an associated four bit data signal, to the data bus structured as a four-bit data bus. At 1220, a data bit inversion signal associated with the two bits of the data signal is calculated. Calculating a data bit inversion signal can include using values of previous data bit signals output to the two bus lines and a value of a previous data bit inversion signal output to the data bit inversion line.

At 1230, two associated bits are output from the bus driver/receiver circuit to two bus lines of a data, bus coupled to the bus driver/receiver circuit. The two associated bits correspond to the received two bits based on the calculated data bit inversion signal. Outputting the two associated bits from the bus driver/receiver circuit and outputting the calculated data bit inversion signal from the bus driver/receiver circuit can include outputting the two associated bits and the calculated data bit inversion signal from the bus driver/receiver circuit to a bi-directional data bus. Alternatively, outputting the two associated bits from the bus driver/receiver circuit and outputting the calculated data bit inversion signal from the bus driver/receiver circuit can include outputting the two associated bits and the calculated data bit inversion signal from the bus driver/receiver circuit to a uni-directional data bus. An apparatus may include both a bi-directional data bus and a uni-directional to which method 1200 can be implemented.

At 1240, the calculated data bit inversion signal is output from the bus driver/receiver circuit to a data bit inversion line of the data bus, where the data bit inversion line is disposed directly between and running adjacent to the two bus lines with shield lines adjacent the two bus lines and opposite the data bit inversion line.

Variations of method 1200 or methods similar to method 1200 can include a number of different embodiments that may depending on the application of such methods and/or the architecture of systems in which such methods are implemented. Such methods can include one or more features of a data bus, driver circuits, receiver circuits, and associated devices and architectures as taught herein.

In various embodiments, an apparatus can comprise: a first line extending to convey a first data signal; a second line extending to convey a second data signal; a third line extending to convey a DBI signal produced correspondingly to the first data signal and the second data signal; a first shield line; and a second shield line, where first one of the first, second, and third lines is directly adjacent to each of second one of the first, second and third lines and third one of the first, second and third lines; where the first shield line is directly adjacent to the second one of the first, second and third lines; and where the second shield line is directly adjacent to the third one of the first, second and third lines. Such apparatus or similar apparatus can further comprise a driver circuit configured to produce the DBI signal based on the first and second data signals. Such apparatus or similar apparatus can further comprise a fourth line extending to convey a third data signal; a fifth line extending to convey a fourth data signal; a sixth line extending to convey an additional DBI signal produced correspondingly to the third data signal and the fourth data signal; and a third shield line; where first one of the fourth, fifth, and sixth lines is directly adjacent to each of second one of the fourth, fifth and sixth lines and third one of the fourth, fifth and sixth lines with the second shield line being directly adjacent to the second one of the fourth, fifth and sixth lines and the third shield line being directly adjacent to the third one of the fourth, fifth and sixth lines. Such apparatus or similar apparatus can further comprise a first driver circuit configured to produce the DBI signal based on the first and second data signals regardless of the third and fourth signals; and a second driver circuit configured to produce the additional DBI signal based on the third and fourth data signals regardless of the first and second signals.

Variations of such apparatus can include a number of different embodiments that may depend on the application of such methods and/or the architecture of systems in which such methods are implemented. Such apparatus can further comprise a core chip including a plurality of memory cells and an interface chip stacked with the core chip, where the interface chip includes first and second through substrate vias electrically coupled to the core chip and first and second micro bumps, the first and second lines being provided in the interface chip and coupled between the first and second through substrate vias and the first and second micro bumps, respectively.

Variations of such apparatus or similar apparatus can further comprise a core chip including a plurality of memory cells and an interface chip stacked with the core chip, the interface chip includes a first logic circuit arranged along a first side of the interface chip and a second logic circuit arranged along a second side of the interface chip opposite to the first side, the first and second lines being provided in the interface chip and coupled between the first and second logic circuits. Variations of such apparatus or similar apparatus can further comprise a core chip including a plurality of memory cells and an interface chip stacked with the core chip, where the core chip includes a first logic circuit arranged along a first side of the core chip and a second logic circuit arranged along a second side of the core chip opposite to the first side, the first and second lines being provided in the core chip and coupled between the first and second logic circuits.

In various embodiments, an apparatus can comprise: a data bus having a number of bus lines; a set of bi-directional bus driver/receiver circuits, each bi-directional bus driver/receiver circuit coupled to two bus lines of the data bus, each bus line of the two bus lines arranged to propagate a data bit signal, and each bi-directional bus driver/receiver circuit coupled to a data bit inversion line of the data bus arranged to propagate a data bit inversion signal associated with the data bit signals of the two bus lines; and a set of shield lines including a shield line arranged adjacent to one bus line of the two bus lines and another shield line arranged adjacent to the other bus line of the two bus lines such that the two bus lines are between the shield line and the other shield line with the data bit inversion line disposed directly between and running adjacent to the two bus lines. Each bi-directional bus driver/receiver circuit can have a calculator to generate the data bit inversion signal to transmit on the data bit inversion line of the data bus coupled to the respective bi-directional bus driver/receiver circuit and a data bit inversion decoder to decode a data bit inversion signal received from the data bit inversion line of the data bus coupled to the respective bi-directional bus driver/receiver circuit. The calculator to generate the data bit inversion signal can be arranged with inputs to receive values of previous data bit signals output to the two bus lines and receive a value of a previous data bit inversion signal output to the data bit inversion line.

Variations of such apparatus can include a number of different embodiments that may depend on the application of such methods and/or the architecture of systems in which such methods are implemented. Such apparatus can include the set of bi-directional bus driver/receiver circuits to include two bi-directional bus driver/receiver circuits of the set arranged at a common end of the data bus, the two bus lines and data bit inversion line of each of the two bi-directional bus driver/receiver circuits defining a bundle with a shield line on each side of the bundle opposite the data bit inversion line, each of the bundles sharing one of the shield lines.

Variations of such apparatus can include a number of different embodiments that may depend on the application of such apparatus anchor the architecture of systems in which such apparatus are implemented. Such apparatus can comprise the data bus being a four-bit signal data bus and the set of bi-directional bus driver/receiver circuits having four bi-directional bus driver/receiver circuits coupled to the four-bit signal data bus with two bi-directional bus driver/receiver circuits of the four bi-directional bus driver/receiver circuits at one end of the four-bit signal data bus and the other two bi-directional bus driver/receiver circuits of the four bi-directional bus driver/receiver circuits at the other end of the four-bit signal data bus. The two bi-directional bus driver/receiver circuits of the four bi-directional bus driver/receiver circuits at one end of the four-bit signal data bus can be disposed in an interface chip and the other two bi-directional bus driver/receiver circuits of the four bi-directional bus driver/receiver circuits at the other end of the four-bit signal data bus can be disposed in a core chip located in a stack above the interface chip. The interface chip and the core chip may be part of a high density memory. The two bi-directional bus driver/receiver circuits of the four bi-directional bus driver/receiver circuits at one end of the four-bit signal data bus and the other two bi-directional bus driver/receiver circuits of the four bi-directional bus driver/receiver circuits at the other end of the four-bit signal data bus can be disposed in one chip.

In various embodiments, an apparatus can comprise: a data bus having a number of bus lines; a calculator to generate a data bit inversion signal, the calculator coupled to two bus lines of the data bus, each bus line of the two bus lines arranged to propagate a data bit signal, and coupled to a data hit inversion line of the data bus arranged to propagate a data bit inversion signal associated with the data bit signals of the two bus lines; and a set of shield lines including a shield line adjacent one bus line of the two bus lines and opposite the data bit inversion line with the data. bit inversion line disposed directly between and running adjacent to the two bus lines, and including another shield line adjacent the other bus line of the two bus lines and opposite the data bit inversion line. The data bus can be a uni-directional data bus. The calculator can include logic devices to calculate the data bit inversion signal using values of previous data bit signals output to the two bus lines and a value of a previous data bit inversion signal output to the data bit inversion line. The apparatus can include a data bit inversion decoder coupled to an end of the uni-directional data bus opposite an end at which the calculator is coupled to the uni-directional data bus.

Figure 13:
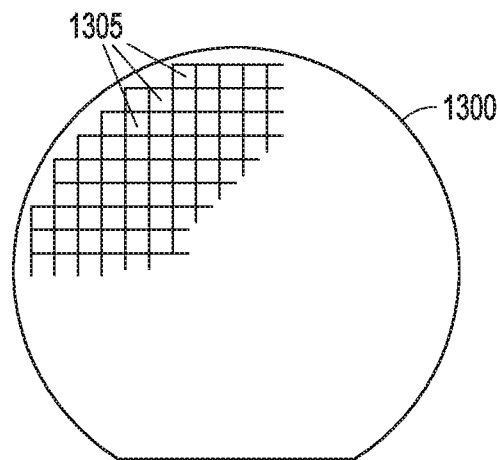
FIG. 13 illustrates an example of a wafer arranged to provide multiple electronic components, according to various embodiments.

FIG. 13 illustrates an embodiment of an example of a wafer 1300 arranged to provide multiple electronic components. Wafer 1300 can be provided as a wafer in which a number of dice 1305 can be fabricated. Alternatively, wafer 1300 can be provided as a wafer in which the number of dice 1305 have been processed to provide electronic functionality and are awaiting singulation from wafer 1300 for packaging. Wafer 1300 can be provided as a semiconductor wafer, a semiconductor on insulator wafer, or other appropriate wafer for processing electronic devices such as an integrated circuit chips.

Using various masking and processing techniques, each die 1305 can he processed to include functional circuitry such that each die 1305 is fabricated as an integrated circuit with the same functionality and packaged structure as the other dice on wafer 1300. Alternatively, using various masking and processing techniques, various sets of dice 1305 can be processed to include functional circuitry such that not all of the dice 1305 are fabricated as an integrated circuit with the same functionality and packaged structure as the other dice on wafer 1300. Packaged die or dice having circuits integrated thereon providing electronic capabilities may also be referred to as an integrated circuit.

Wafer 1300 can comprise multiple dice 1305. Each die 1305 of the multiple dice can be structured to include a data bus having data lines and shield lines, as taught herein, or to include nodes to couple to such a data bus having data lines and shield lines. Each die 1305 can include a driver circuit and/or a receiver circuit, where the driver circuit includes a DBI calculator to generate a DBI signal for communication on the data bus and the receiver circuit includes a DBI decoder to decode a DBI signal transmitted on the data bus. The data bus may be a bi-directional data bus or a uni-directional data bus. The data bus may be arranged as a bundled set of data lines with shield lines arranged with respect to two bit data signals of a data signal having two or more component data signals.

Figure 14:
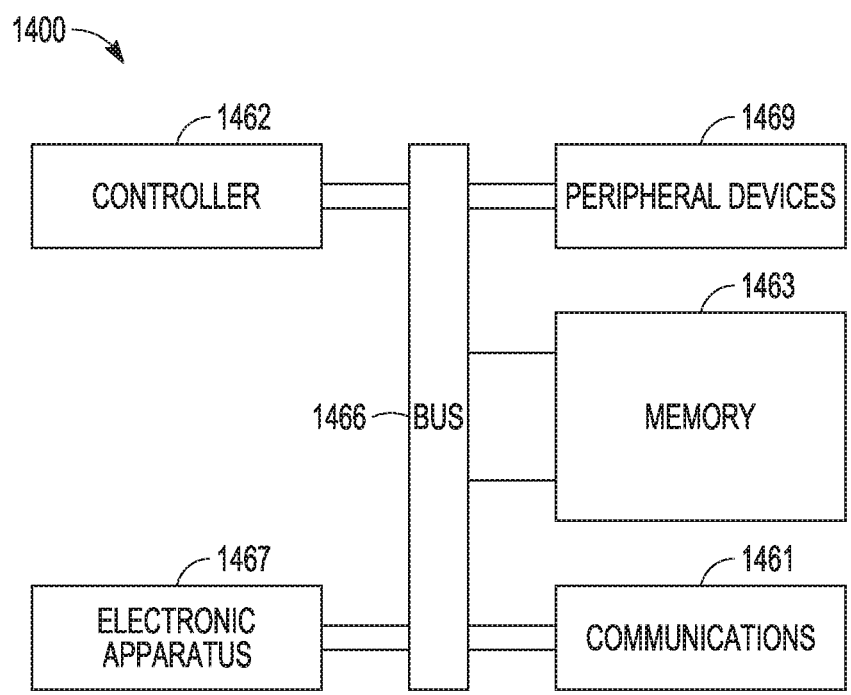
FIG. 14 is a block diagram of an example system that includes one or more data buses having data lines and shield lines, according to various embodiments

FIG. 14 is a block diagram of an embodiment of an example system 1400 that includes one or more data buses 1466 having data lines and shield lines, as taught herein. System 1400 can include a controller 1462 operatively coupled to memory 1463. System 1400 can also include an electronic apparatus 1467, peripheral devices 1469, and communications 1461. One or more of controller 1462, memory 1463, electronic apparatus 1467, communications 1461, or peripheral devices 1469 can he in the form of one or more ICs.

A bus 1466 provides electrical conductivity between and/or among various components of system 1400. In an embodiment, bus 1466 can include an address bus, a data bus, and a control bus, each independently configured. In an alternative embodiment, bus 1466 can use common conductive lines for providing one or more of address, data, or control, the use of which is regulated by controller 1462. Bus 1466 can include data lines and shield lines, as taught herein, disposed within one or more components of system 1440.

Controller 1462 can be in the form or one or more processors. Electronic apparatus 1467 may include additional memory. Memory 1463 in system 1400 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory. Memory 1463 can be realized as a system of memory chips stacked on an interface chip, such as a logic die. Each memory chip of memory 1463 can have a set of driver circuits and/or a set of receiver circuits to couple to bus 1466 having a DBI calculator or DBI decoder for transmission of data signals on bus 1466, as taught herein.

Peripheral devices 1469 may include displays, imaging devices, printing devices, wireless devices, additional storage memory, and control devices that may operate in conjunction with controller 1462. In various embodiments, system 1400 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that other arrangements derived from the teachings herein may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. An apparatus comprising:
   a first line extending to convey a first data signal;
   a second line extending to convey a second data signal;
   a third line extending to convey a data bit inversion (DBI) signal produced correspondingly to the first data signal and the second data signal;
   a first shield line: and
   a second shield line;
   wherein a first one of the first, second, and third lines is directly adjacent to each of a second one of the first, second and third lines and a third one of the first, second and third lines such that the first one is between the second one and the third one; and
   wherein the first shield line is directly adjacent to and extends adjacently to the second one of the first, second and third lines; and
   wherein the second shield line is directly adjacent to and extends adjacently to the third one of the first, second and third lines such that the first line, the second line, and the third line extend adjacently to one another and between the first shield line and the second shield line.

2. The apparatus of claim 1, further comprising a driver circuit configured to produce the DBI signal based on the first and second data signals.

3. The apparatus of claim 1, further comprising:
   a fourth line extending to convey a third data signal;
   a fifth line extending to convey a fourth data signal:
   a sixth line extending to convey an additional DBI signal produced correspondingly to the third data signal and the fourth data signal; and
   a third shield line;
   wherein a fourth one of the fourth, fifth, and sixth lines is directly adjacent to each of a fifth one of the fourth, fifth and sixth lines and a sixth one of the fourth, fifth and sixth lines;
   wherein the second shield line is directly adjacent to the fifth one of the fourth, fifth and sixth lines; and
   wherein the third shield line is directly adjacent to the sixth one of the fourth, fifth and sixth lines such that the fourth line, the fifth line, and the sixth line extend adjacently to one another and between the second shield line and the third shield line.

4. The apparatus of claim 3, further comprising:
   a first driver circuit configured to produce the DBI signal based on the first and second data signals regardless of the third and fourth data signals; and
   a second driver circuit configured to produce the additional DBI signal based on the third and fourth data signals regardless of the first and second data signals.

5. The apparatus of claim 1, further comprising a core chip including a plurality of memory cells and an interface chip stacked with the core chip, the interface chip including first and second through substrate vias electrically coupled to the core chip and first and second micro bumps, the first and second lines being provided in the interface chip and coupled between the first and second through substrate vias and the first and second micro bumps, respectively.

6. The apparatus of claim 1, further comprising a core chip including a plurality of memory cells and an interface chip stacked with the core chip, the interface chip includes a first logic circuit arranged along a first side of the interface chip and a second logic circuit arranged along a second side of the interface chip opposite to the first side, the first and second lines being provided in the interface chip and coupled between the first and second logic circuits.

7. An apparatus comprising:
a data bus having a number of bus lines;
a set of bi-directional bus driver/receiver circuits, each bi-directional bus driver/receiver circuit coupled to two bus lines of the data bus, each bus line of the two bus lines arranged to propagate a data bit signal, and each bi-directional bus driver/receiver circuit coupled to a data bit inversion line of the data bus arranged to propagate a data bit inversion signal associated with the data bit signals of the two bus lines; and
a set of shield lines including a shield line arranged adjacent to one bus line of the two bus lines and another shield line arranged adjacent to the other bus line of the two bus lines such that the two bus lines are between the shield line and the other shield line with the data bit inversion line disposed directly between and running adjacent to the two bus lines.

8. The apparatus of claim 7, wherein each bi-directional bus driver/receiver circuit has a calculator to generate the data bit inversion signal to transmit on the data bit inversion line of the data bus coupled to the respective bi-directional bus driver/receiver circuit and a data bit inversion decoder to decode a data bit inversion signal received from the data bit inversion line of the data bus coupled to the respective bi-directional bus driver/receiver circuit.

9. The apparatus of claim 8, wherein the calculator to generate the data bit inversion signal is arranged with inputs to receive values of previous data hit signals output to the two bus lines and receive a value of a previous data bit inversion signal output to the data bit inversion line.

10. The apparatus of claim 7, wherein the set of bi-directional bus driver/receiver circuits includes two bi-directional bus driver/receiver circuits of the set arranged at a common end of the data bus, the two bus lines and data bit inversion line of each of the two bi-directional bus driver/receiver circuits defining a bundle with a shield line on each side of the bundle opposite the data bit inversion line, each of the bundles sharing one of the shield lines.

11. The apparatus of claim 7, wherein the data bus is a four-bit signal data bus and the set of bi-directional bus driver/receiver circuits has four bi-directional bus driver/receiver circuits coupled to the four-bit signal data bus with two bi-directional bus driver/receiver circuits of the four bi-directional bus driver/receiver circuits at one end of the four-bit signal data bus and the other two bi-directional bus driver/receiver circuits of the four bi-directional bus driver/receiver circuits at the other end of the four-bit signal data bus.

12. The apparatus of claim 11, wherein the two bi-directional bus driver/receiver circuits of the four bi-directional bus driver/receiver circuits at one end of the four-bit signal data bus are disposed in an interface chip and the other two bi-directional bus driver/receiver circuits of the four bi-directional bus driver/receiver circuits at the other end of the four-bit signal data bus are disposed in a core chip located in a stack above the interface chip.

13. The apparatus of claim 12, wherein the interface chip and the core chip are part of a high density memory.

14. The apparatus of claim 11, wherein the two bi-directional bus driver/receiver circuits of the four bi-directional bus driver/receiver circuits at one end of the four-bit signal data bus and the other two bi-directional bus driver/receiver circuits of the four bi-directional bus driver/receiver circuits at the other end of the four-bit signal data bus are disposed in one chip.

15. An apparatus comprising:
a data bus having a number of bus lines;
a calculator to generate a data bit inversion signal, the calculator coupled to two bus lines of the data bus, each bus line of the two bus lines arranged to propagate a data bit signal, and
coupled to a data bit inversion line of the data bus arranged to propagate a data bit inversion signal associated with the data bit signals of the two bus lines; and
a set of shield lines including g a shield line adjacent one bus line of the two bus lines and opposite the data hit inversion line with the data bit inversion line disposed directly between and running adjacent to the two bus lines, and including another shield line adjacent the other bus line of the two bus lines and opposite the data bit inversion line.

16. The apparatus of claim 15, wherein the data bus is a uni-directional data bus.

17. The apparatus of claim 16, wherein the apparatus includes a data bit inversion decoder coupled to an end of the uni-directional data bus opposite an end at which the calculator is coupled to the uni-directional data bus.

18. The apparatus of claim 16, wherein the calculator includes logic devices to calculate the data bit inversion signal using values of previous data bit signals output to the two bus lines and a value of a previous data bit inversion signal output to the data bit inversion line.

19. A method comprising:
receiving two bits of a data signal at a bus driver/receiver circuit:
calculating a data bit inversion signal associated with the two bits of the data signal;
outputting two associated bits from the bus driver/receiver circuit to two bus lines of a data bus coupled to the bus driver/receiver circuit, the two associated bits corresponding to the received two bits based on the calculated data bit inversion signal; and
outputting the calculated data bit inversion signal from the bus driver/receiver circuit to a data bit in version line of the data bus, the data bit inversion line disposed directly between and running adjacent to the two bus lines with a shield line adjacent one bus line of the two bus lines and opposite the data bit inversion line and another shield line adjacent the other bus line of the two bus lines and opposite the data bit in version line.

20. The method of claim 19, wherein outputting the two associated bits from the bus driver/receiver circuit and outputting the calculated data bit inversion signal from the bus driver/receiver circuit includes outputting the two associated hits and the calculated data bit inversion signal from the bus driver/receiver circuit to a uni-directional data bus.

21. The method of claim 19, wherein calculating a data bit inversion signal includes using values of previous data bit signals output to the two bus lines and a value of a previous data bit inversion signal output to the data bit inversion line.

22. The method of claim 19, wherein receiving the two bits of the data signal and outputting the two associated bits from the bus driver/receiver circuit to two bus tines of the data bus includes receiving the two bits as two bits of a four bit data signal and coupling the two associated bits, as an associated two bit data signal of an associated four bit data signal, to the data bus structured as a four-bit data bus.

* * * * *